(12) United States Patent
Chen et al.

(10) Patent No.: US 12,382,606 B2
(45) Date of Patent: Aug. 5, 2025

(54) ELECTRONIC DEVICES

(71) Applicant: Advanced Liquid Cooling Technologies Inc., Anderson, SC (US)

(72) Inventors: Nan Chen, Templestowe (AU); He Zhao, Flagstaff Hill (AU); Yunshui Chen, San Ramon, CA (US)

(73) Assignee: Advanced Liquid Cooling Technologies Inc., Anderson, SC (US)

( * ) Notice: Subject to any disclaimer, the term of this patent is extended or adjusted under 35 U.S.C. 154(b) by 511 days.

(21) Appl. No.: 17/487,013

(22) Filed: Sep. 28, 2021

(65) Prior Publication Data

US 2022/0418160 A1 Dec. 29, 2022

Related U.S. Application Data

(63) Continuation-in-part of application No. 17/360,003, filed on Jun. 28, 2021.

(51) Int. Cl.
H05K 7/20 (2006.01)

(52) U.S. Cl.
CPC ..... H05K 7/20272 (2013.01); H05K 7/20263 (2013.01)

(58) Field of Classification Search
CPC .......... H05K 7/20272; H05K 7/20263; H05K 7/208; H05K 7/20318
See application file for complete search history.

(56) References Cited

U.S. PATENT DOCUMENTS

| | | | |
|---|---|---|---|
| 2,049,748 A * | 8/1936 | Rathbun | F28D 7/1646 165/172 |
| 9,777,964 B2 * | 10/2017 | Taras | F28D 7/16 |
| 2008/0256975 A1* | 10/2008 | Lifson | F25B 1/10 62/509 |
| 2009/0211743 A1* | 8/2009 | Schrader | F28F 9/0221 165/173 |
| 2012/0199331 A1* | 8/2012 | Maurer | F28D 7/024 165/172 |
| 2013/0186604 A1* | 7/2013 | Geppert | F28D 1/0478 29/890.03 |

* cited by examiner

*Primary Examiner* — Lionel Nouketcha
(74) *Attorney, Agent, or Firm* — Nutter McClennen & Fish LLP

(57) ABSTRACT

A system having a shell with a shell interior for housing a heat exchanger that is configured to be operable for heat transfer between a first fluid and a second fluid; a refrigerant inlet, wherein the first fluid passes from the refrigerant inlet to the shell interior for heat transfer; a refrigerant inlet manifold, wherein the refrigerant inlet manifold is configured to collect the first fluid from the refrigerant inlet for the heat transfer; a refrigerant outlet, the refrigerant outlet is configured to be operable for supplying the first fluid for electronic device cooling; a coolant inlet, wherein the second fluid flows from the coolant inlet and into the shell interior for the heat transfer; and a coolant outlet for discharging the second fluid out of the shell interior.

20 Claims, 12 Drawing Sheets

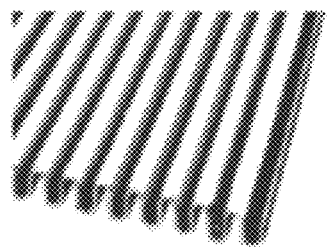 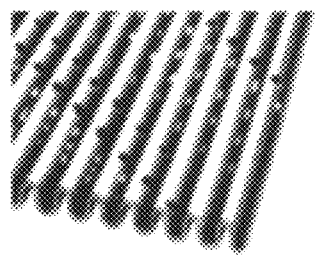 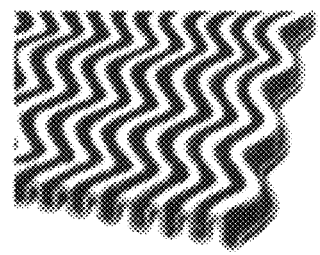
Fig. 6A            Fig. 6B            Fig. 6C
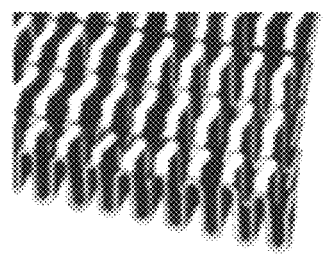 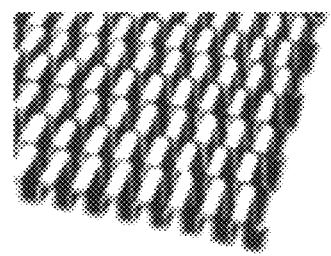
Fig. 6D            Fig. 6E
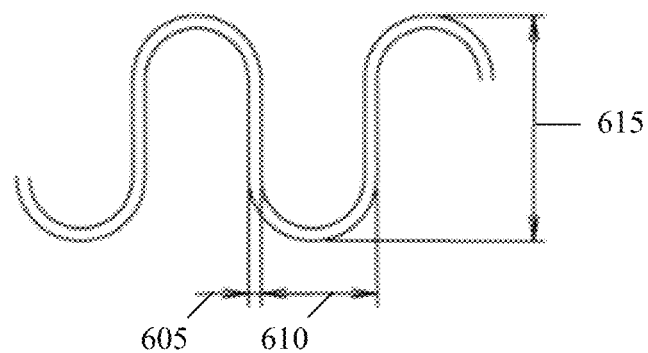
Fig. 6F

ELECTRONIC DEVICES

CROSS-REFERENCE TO RELATED APPLICATIONS

The present continuation-in-part patent application claims priority benefit under 35 U.S.C. 120 of the U.S. nonprovisional patent application Ser. No. 17/360,003, "A Reverse-Return Parallel Loop Thermal Management System for an Electronic Device", filed on 28 Jun. 2021, under 35 U.S.C. 119 (e). The contents of this/these related patent application(s) is/are incorporated herein by reference for all purposes to the extent that such subject matter is not inconsistent herewith or limiting hereof.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to a heat exchanger systems. More particularly, certain embodiments of the invention relate to a microchannel heat exchanger system for efficient cooling of electronic devices.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Efficient electronic device cooling may result in lowered cost and higher performance of electronic devices, and may be a critical, limiting factor, especially in industrial settings. Server racks, for example, without limitation, may comprise many different computing devices, and thus may require ample cooling in order to operate at maximum, or close to maximum capacity. Conventional cooling solutions, such as air cooling or liquid cooling, may be used to reduce the heat of existing systems, but may not be optimal solutions, especially in large scale operations.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art generally useful to be aware of is that heat exchangers may be used for electronic device cooling. Conventional heat exchangers may be used as a part of a system for cooling electronic devices. Such heat exchangers may utilize channels filled with coolant but may not be optimal solutions in many situations. For example, without limitation, a low heat coefficient of existing cooling mechanisms within conventional heat exchangers may result in inefficient cooling capabilities, and high-pressure drop may be a problem in many systems.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A-2C illustrate an exemplary MCHX, wherein FIG. 2A shows a side view of a MCHX, FIG. 2B shows a plan view of a MCHX, and FIG. 2C shows a perspective view of a MCHX;

FIGS. 3A-3C illustrate an exemplary microchannel plate-fin heat exchanger, wherein FIG. 3A illustrates a first plan view of a microchannel plate-fin heat exchanger, FIG. 3B illustrates a second plan view of a microchannel plate-fin heat exchanger, and FIG. 3C illustrates a plan view of the manifolds of a microchannel plate-fin heat exchanger, in accordance with an embodiment of the present invention;

FIG. 6A-6F illustrate exemplary fins, wherein FIG. 6A shows a plain type of fin pattern, FIG. 6B shows a perforated type of fin pattern, FIG. 6C shows a herringbone type fin pattern, FIG. 6D shows a louvered type of fin pattern, FIG. 6E shows a serrated type fin pattern, and FIG. 6F shows fin dimensions, in accordance with an embodiment of the present invention;

FIGS. 7A-7B illustrate an exemplary multi-pass flow microchannel heat exchanger, wherein FIG. 7A shows a plan view of a multi-pass flow microchannel heat exchanger, and FIG. 7B shows a perspective view of a multi-pass flow microchannel heat exchanger, in accordance with an embodiment of the present invention;

FIGS. 8A-8C illustrate an exemplary counterflow heat exchanger, wherein FIG. 8A shows a plan view of a counterflow heat exchanger, FIG. 8B shows a perspective view of a counterflow heat exchanger, and FIG. 8C shows a heat exchanging element of a counterflow heat exchanger, in accordance with an embodiment of the present invention;

FIGS. 9A-9B illustrate an exemplary crossflow heat exchanger, wherein FIG. 9A shows a plan view of a crossflow heat exchanger, and FIG. 9B shows a perspective view of a cross-flow heat exchanger, in accordance with an embodiment of the present invention;

Figure 1:
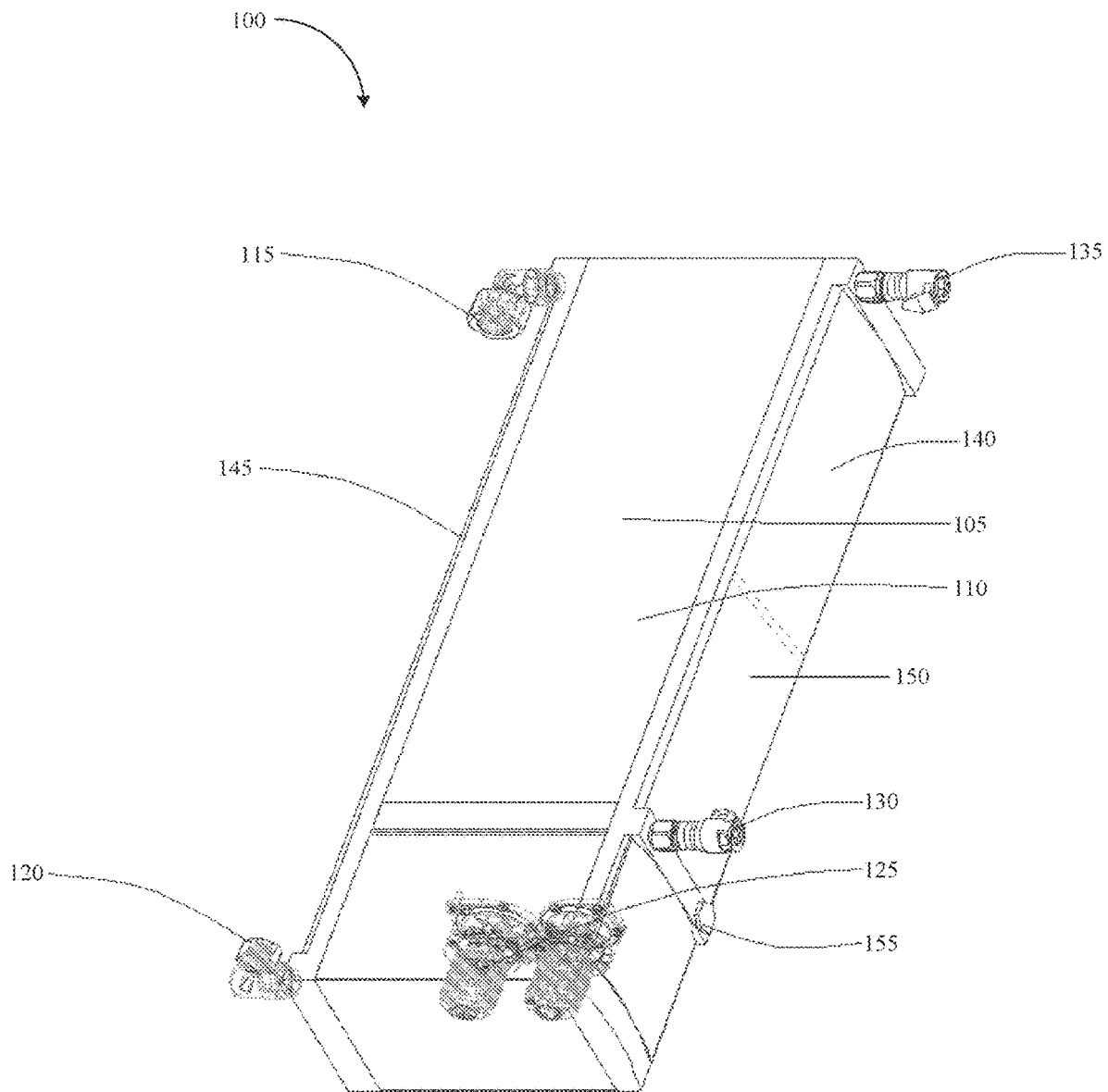
FIG. 1 illustrates an exemplary microchannel heat exchanger system, in accordance with an embodiment of the present invention.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognized in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311. Similarly, the plain language of claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said, "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred, or induced by any pattern(s) of description, embodiments, examples, or referenced prior art that may (or may not) be provided in the present patent.

References to "end user", or any similar term, as used herein, is generally intended to mean late-stage user(s) as opposed to early-stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising" And "contain" and variations of them— Such terms are open-ended and mean "including but not limited to". When employed in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C . . . sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

All terms of exemplary language (e.g., including, without limitation, "such as", "like", "for example", "for instance", "similar to", etc.) are not exclusive of any other, potentially, unrelated, types of examples; thus, implicitly mean "by way of example, and not limitation . . . ", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus, in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s).

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

It is to be understood that any exact measurements/ dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

FIG. 1 illustrates an exemplary microchannel heat exchanger system, in accordance with an embodiment of the present invention. Microchannel heat exchanger (MCHX) 100 may be compact plate-fin heat exchanger utilizing microchannel tubes for condensation-based heat exchange. MCHX 100 may comprise shell 105, interior 110, refrigerant inlet 115 and refrigerant outlet 120 coupled to shell 105 by which a first fluid (i.e., refrigerant) may flow in and out of interior 110, and one or more refrigerant pumps 125. The quantity or number of pumps may depend on the required flow volume and pressure head against those provided by a single pump. Multiple pumps may provide two major benefits, i.e., higher flow volume and higher system reliability where one of the pumps may be a backup in case the operating pump fails. There may be no quantity limit of pumps because it may depend on what the system needs (for example, cooling load) and what each pump is capable of providing. Similarly, coolant inlet 130, coolant outlet 135, first coolant manifold 140, second coolant manifold 145, third coolant manifold 150, may be configured to transmit a second fluid (i.e., coolant) through interior 110 of MCHX 100 such that heat transfer may occur between the first fluid and the second fluid. Microchannel tubes 205 may comprise, but not limited to, generally or largely flat, round, oblong, square, or rectangular shaped tube. she coolant from coolant inlet 130 may flow into the third coolant manifold 150 at first, then the coolant may flow through the microchannel tubes 205 as the first pass, which are connected with the third coolant manifold 150 at the one end and connected with the second coolant manifold 145 at the other end, and flow into the second coolant manifold 145. The coolant in the second coolant manifold 145 may turn around and flow into the other part of microchannel tubes 205 as the second pass (which are connected with the second coolant manifold 145 at the one end and connected with the first coolant manifold 140 at the other end). The function of the third coolant manifold 150 is to collect the coolant from coolant inlet 130 and distribute the coolant evenly into the microchannel tubes 205 (as the first pass). The function of the second coolant manifold 145 is to collect the outflow from the microchannel tubes 205 in the first pass and distribute the coolant into the microchannel tubes 205 in the second pass. The function of the first coolant manifold 140 is to collect the outflow of microchannel tubes 205 in the second pass and guide the coolant into coolant outlet 135. The volume ratio between first coolant manifold 140 and third coolant manifold 150 may depend on the quantity of microchannel tubes 205 in the first pass and second pass. All microchannel tubes 205 may be connected with second coolant manifold 145. The inlet end of microchannel tubes 205 in the first pass would be connected with third coolant manifold 150. The outlet end of microchannel tube 205 in the first pass would be connected with second coolant manifold 145. The inlet end of microchannel tubes 205 in the second pass may be connected with second coolant manifold 145 and the outlet end of microchannel tubes 205 in the second pass may be connected with first coolant manifold 140. More flow passes could be easily realized by separating the manifold into more segments. For example, the four flow passes could be realized by putting one cut plate in the second coolant manifold 145 (to form two chambers) and putting two cut plate at proper position in the volume merged by third coolant manifold 150 and first coolant manifold 140 (to form three chambers). Service port 155 may be reserved for vacuuming and charging activities.

Figure 2A:
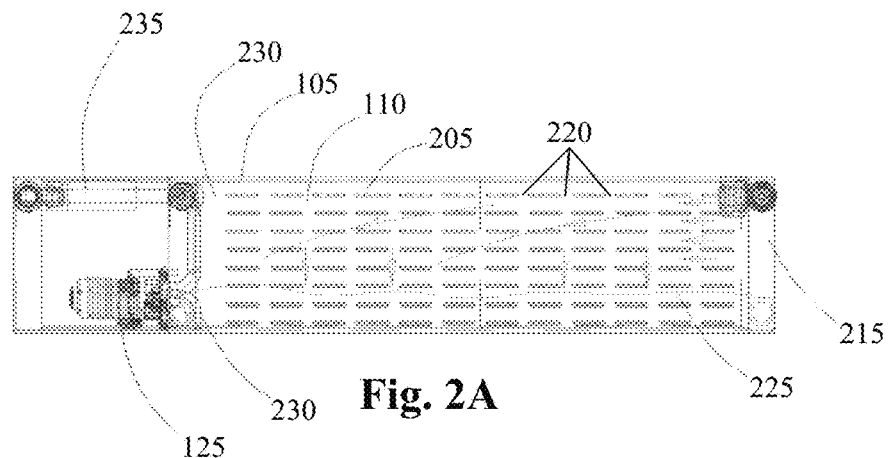
Figure 2B:
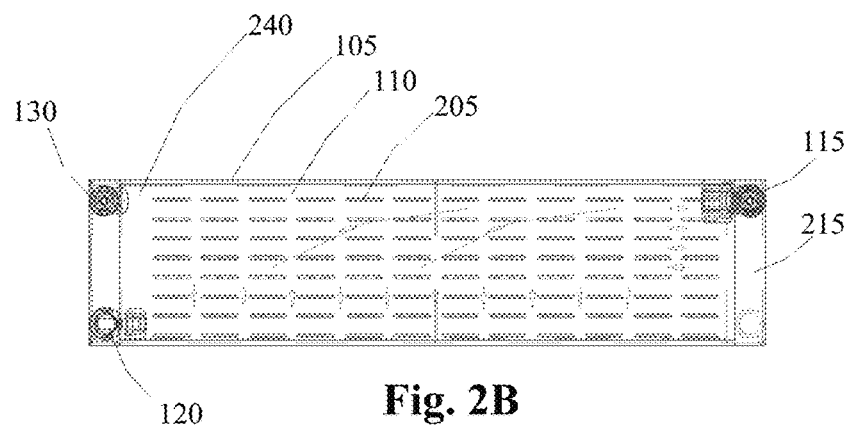
Figure 2C:
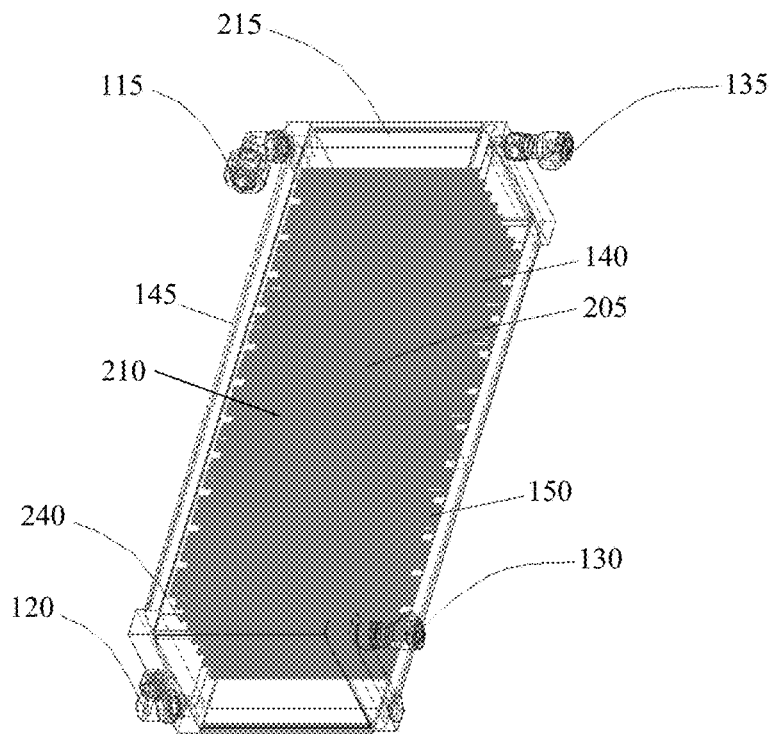

FIGS. 2A-2C illustrate an exemplary MCHX, wherein FIG. 2A shows a side view of the MCHX and refrigerant pump, where the MCHX and the refrigerant pump is integrated as a single unit. FIG. 2B shows a plan view of a MCHX only, which may be connected to an external refrigerant pump unit, and FIG. 2C shows a perspective view of an independent MCHX. With reference to FIG. 1 and FIGS. 2A-2C, the second fluid such as, without limitation, water, glycol, brine, etc. may be directed through microchannel tubes 205. Heat exchanging element 210 may be formed from protruded microchannel tubes 205. The first fluid (i.e., refrigerant) may flow from refrigerant inlet 115 to refrigerant inlet manifold 215 and be condensed on the surface of microchannel tubes 205 as a result of heat transfer from the first fluid to the second fluid within microchannel tubes 205. The volume of refrigerant inlet manifold 215 must be large enough to allow for vapor-gas separation, as the first fluid from refrigerant inlet 115 may be a mixture of liquid and vapor. The vapor-gas separation may depend on the vapor velocity and geometrical flow path of vapor. The critical gravity separation vapor velocity could be calculated by Souders-Brown equations. The vapor may contact the cold surface of microchannel tubes 205, which may cause a portion of the vapor to be condensed. The dynamic equilibrium between the quantity of vapor condensing and the quantity of pump suction may exist in the heat exchanger. Liquid condensed by cold coolant may be suctioned into the pump and then supplied to cool the heat sources. So, two phase status will be kept in the heat exchanger. Condensed liquid may be drained through gaps 220 between microchannel tubes 205 and collected at the bottom of shell 105. Liquid level 225 may be present at an initial charge and may need to be maintained during the cooling process. The reasonable liquid level may be maintained above a certain level throughout the whole cooling process. Using one or more refrigerant pumps 125, the accumulated liquid may be suctioned through refrigerant pump suction line 230 and pumped into refrigerant pump discharging line 235. The one or more refrigerant pumps may each have its own liquid suction line. Subsequently, the liquid refrigerant may be supplied through refrigerant outlet 120 for electronic device cooling. The second fluid may flow into MCHX 100 through coolant inlet 130 and distributed into microchannel tubes 205. After heat is transferred from the first fluid to the second fluid through the surface of microchannel tubes 205, the second fluid may be collected by Refrigerant outlet manifold 240 and third coolant manifold 120 and flow out of MCHX 100 via coolant outlet 120.The refrigerant manifold may be different from the coolant manifold. First fluid may be separated from the second fluid by the microchannel tubes and internal walls of MCHX. The second fluid may be transferred using refrigerant pumps 125 or external pumps.

Figure 3A:
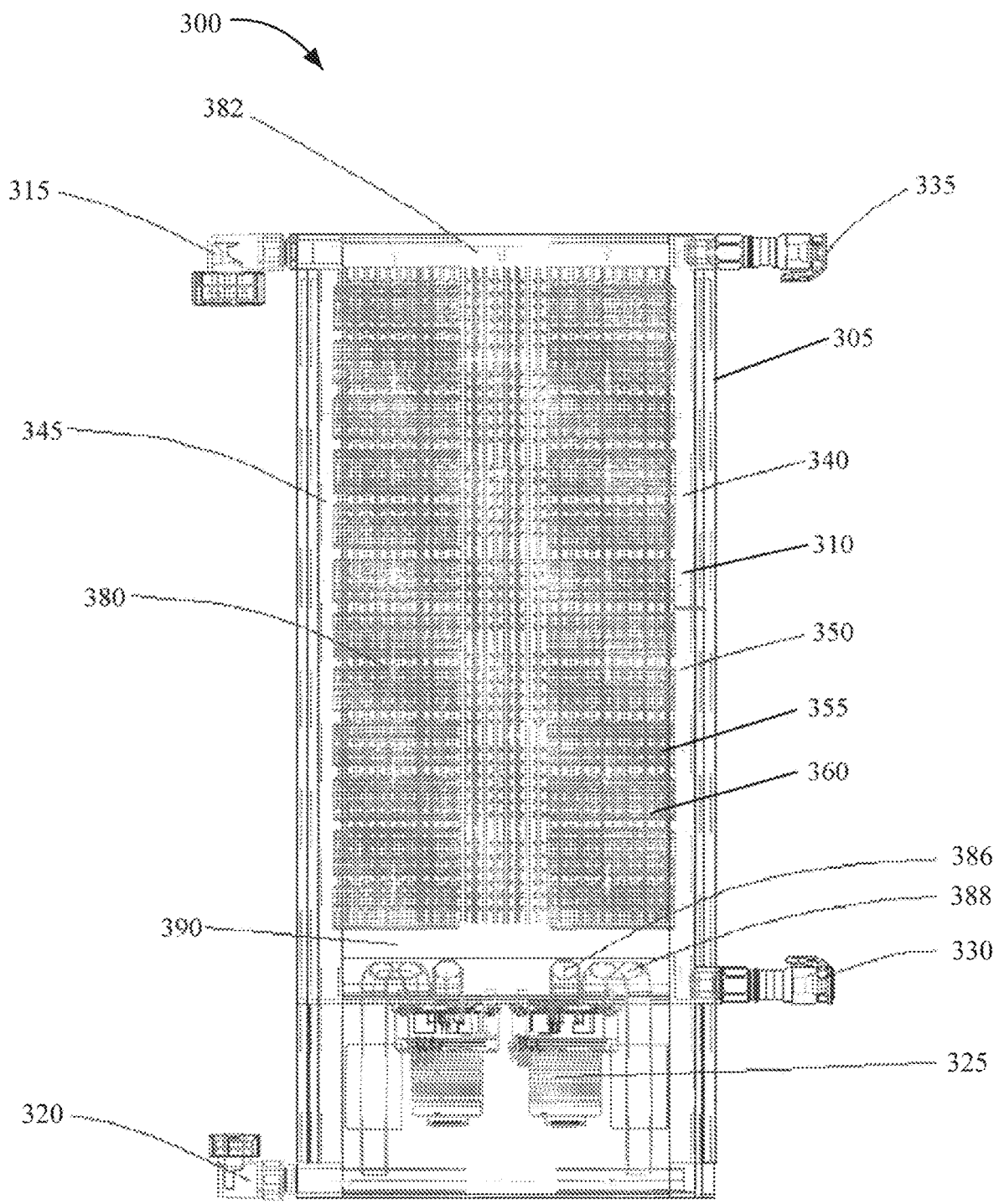
Figure 3B:
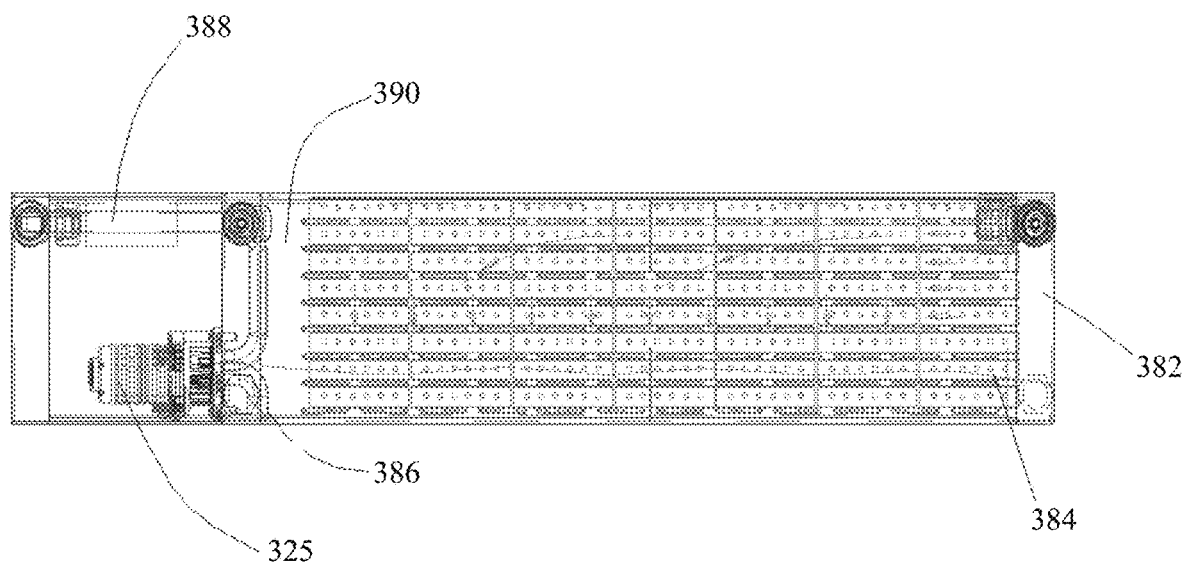
Figure 3C:
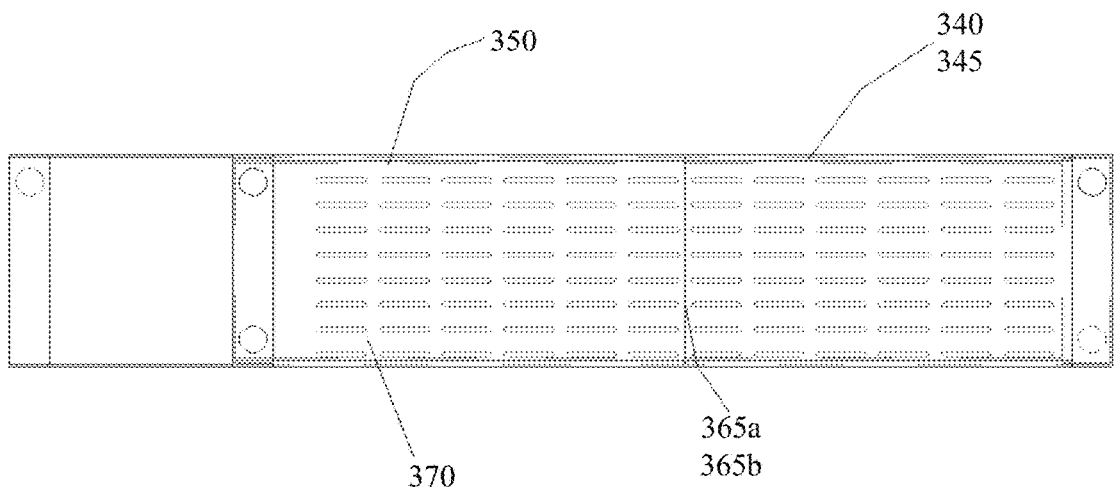

FIGS. 3A-3C illustrate an exemplary microchannel plate-fin heat exchanger, wherein FIG. 3A illustrates a first plan view of a microchannel plate-fin heat exchanger, FIG. 3B illustrates a second plan view of a microchannel plate-fin heat exchanger, and FIG. 3C illustrates a plan view of the manifolds of a microchannel plate-fin heat exchanger, in accordance with an embodiment of the present invention. An increase in heat exchanger effectiveness may be a driving force in increasing overall system efficiency demands and reducing carbon dioxide emissions. In the present embodiment, microchannel plate-fin heat exchanger 300 may intake, for example, without limitation, a two-phase refrigerant to make contact with an outside surface of a cooling element internally cooled via coolant. Thus, microchannel plate-fin heat exchanger may be utilized in more compact configurations and provide enhanced performance, refrigerant charge reduction, and improved structural rigidity when compared with conventional heat exchangers. In contrast to the embodiment shown in FIG. 1 and FIGS. 2A-2C, microchannel plate-fin heat exchanger may utilize fins in addition to microchannel tubes to further enhance cooling performance. Fins 360 may include, for example, without limitation, plain type shaped fins, perforated type shaped fins, herringbone type shaped fins, louvered type shaped fins, serrated type shaped fins, a combination of the different shaped fins, etc. Microchannel plate-fin heat exchanger 300 may comprise shell 305, interior 310, refrigerant inlet 315 and refrigerant outlet 320 coupled to shell 305 by which a first fluid (i.e., refrigerant) may flow in and out of interior 310, and one or more refrigerant pumps 325. Similarly, coolant inlet 330, coolant outlet 335, first coolant manifold 340, second coolant manifold 345, third coolant manifold 350, may be configured to transmit a second fluid (i.e., coolant) through interior 310 of microchannel plate-fin heat exchanger 300 such that heat transfer may occur between the first fluid and the second fluid.

The second fluid, such as, without limitation, coolant, water, glycol, and brine, etc. may be directed through the shell interior with microchannel tubes 355 while the first fluid, which may be a low-pressure refrigerant such as, but not limited to, R134a, R1234yf, HFE 7000, HFE 7100, etc., may flow into interior 310 to be condensed. Water at the proper pressure may work as refrigerant.

The first fluid will flow into the refrigerant inlet manifold 382 and then been distributed into the gap formed by microchannels tubes 355 and fins 360. The vapor of first fluid will be condensed on the cold surface of microchannel tubes 355 and fins 360, then drop to the bottom of interior 310 by gravity. Since the driven force of condensation liquid is gravity, one of the design principles of microchannel tube 355 and fins 360 is that the direction of microchannel tube 355 and fins 360 will lead to the easy drainage of condensation liquid. Thinner liquid film by good drainage attached on the microchannel tube 355 and fins 360 means higher heat transferring efficiency.

As will be appreciated by one skilled in the art, the first fluid may also be a high-pressure refrigerant, such as, without limitation, R410A, CO2, etc. may be directed through the interior of microchannel tubes 355 while the second fluid is directed through interior 310. the first fluid would be refrigerant (working under certain pressure, i.e., 10 bar) in interior space and second fluid in microchannel tubes 355 would be a type of single-phase fluid (working under low pressure, i.e.,5 bar). But regarding the application of high-pressure refrigerant (i.e., 30 bar or above) as the first fluid, it is better to go through the microchannel tubes 355. Because from the structural strength point of view, microchannel tube 355 can work better under the high-pressure conditions than the shell side does. it will cost more money and efforts to let the brazed shell work under high pressure.

Microchannel tubes 355 and fins 360 may be longitudinally disposed throughout interior 310 of microchannel plate-fin heat exchanger 300 in one or more flow passes. Microchannel tubes 355 may comprise, but not limited to, for the most part or customarily flat, round, oblong, square, or rectangular shaped tubes. The one or more flow passes may refer to the number of turns fluids flow through the heat exchanger. Microchannel tubes 355 may be brazed between one or more manifolds such as, without limitation, first coolant manifold 340, second coolant manifold 345, etc. at each side and may be internally connected to the manifolds. The position and number of blind plates 365a inside first coolant manifold 340 may determine the flow pass of the second fluid. Similarly, blind plate 365b in second coolant manifold 345 (if required) coupled with blind plate 365a of first coolant manifold 340 may create many different flow patterns of the second fluid. Microchannel tubes 355 may be installed in slots 370, and the coolant manifolds (i.e., first coolant manifold 340, second coolant manifold 345, and third coolant manifold 350) may be tightly brazed to microchannel tubes 355. Slots 370 may be, for example, without limitation, machined in a normal configuration, machined at an angle to offset microchannel tubes 355 and fins 360 at different angles with the horizon, etc. An angular offset of slots 370 may further facilitate drainage of condensation. Microchannel tubes 355 and fins 360 may be placed in various patterns within microchannel plate-fin heat exchanger depending on the needs of a specific system. For example, without limitation, microchannel tubes 355 may be inline, in a staggered matrix, etc. and fins 360 may also be inline or staggered to correspond to microchannel tubes 355. The number and size of microchannel tubes 355 may depend upon criteria such as, without limitation, heat load, pressure drop, efficiency, etc. and may be analyzed and optimized for a specific system using a computational program. In the present embodiment, microchannel tubes 355 are configured longitudinally through interior 310 intermittently, and fins 360 are similarly configured longitudinally through interior 310 intermittently.

Heat exchanging element 380 may be formed from protruded microchannel tubes 355 and fins 360. The first fluid (i.e., refrigerant) may flow from refrigerant inlet 315 to refrigerant inlet manifold 382 What happen in the refrigerant inlet manifold 382 are separation and distribution. When the return vapor and liquid go into the manifold from return line, their velocity will drop due to the larger internal volume of manifold. One of design criteria of manifold design is to achieve the low velocity under a certain level, which allow the liquid droplets to be separated with the vapor by gravity rather than be carried over with vapor.

Low velocity can also benefit to the distribution of vapor going into the gaps between tubes and fins. The minimal velocity of return vapor and liquid depends on the type of refrigerants and working conditions. But this logic must be considered during the design stage and be condensed on the surface of microchannel tubes 355 and the surface of fins 360 as a result of heat transfer from the first fluid to the second fluid within microchannel tubes 355 and fins 360. The volume of refrigerant inlet manifold 382 must be large enough to allow for vapor-gas separation, as the first fluid from refrigerant inlet 315 may be a mixture of liquid and vapor. The vapor-gas separation may depend on the vapor velocity and geometrical flow path of vapor. The critical gravity separation vapor velocity may be calculated by Souders-Brown equations. The vapor may contact the cold surface of microchannel tubes 355 and fins 360, which may cause a portion of the vapor to be condensed.

The dynamic equilibrium between the quantity of vapor condensing and the quantity of pump suction exists in the heat exchanger. Liquid condensed (first fluid) by cold coolant (second fluid) will be suctioned into the pump and then supplied to cool the heat sources. Accordingly, a two-phase status will be kept in the heat exchanger. Condensed liquid (first fluid) may be drained and collected at the bottom of shell 305. The bottom of shell may provide a liquid reservoir and subcooling for pump suction. Liquid level 384 may be present at an initial charge and throughout the whole cooling process and may need to be maintained above a predetermined level throughout the cooling process. Using refrigerant pump 325, the accumulated liquid may be suctioned through refrigerant pump suction line 386 and pumped into refrigerant pump discharging line 388. When two or more refrigerant pumps 325 are used, each pump may have its own refrigerant pump suction line 386. Subsequently, the liquid refrigerant (first fluid) may be supplied through refrigerant outlet 320 for electronic device cooling. The second fluid may flow into microchannel plate-fin heat exchanger 300 through coolant inlet 330 and distributed into microchannel tubes 355 and fins 360. After heat is transferred from the first fluid to the second fluid through the surface of microchannel tubes 355 and fins 360, the second fluid may be collected by third coolant manifold 350 and flow out of microchannel plate-fin heat exchanger 300 via coolant outlet 335. The refrigerant manifold may be different from the coolant manifold. First fluid may be separated from the second fluid by microchannel flat tubes 355 and fins 360. The second fluid may be transferred using refrigerant pumps 325 or external pumps.

In the present embodiment, shell 305 may be composed of aluminum as a base metal with added copper and/or plastic. As will be appreciated by one skilled in the art, shell 305 may be composed of a variety of different materials, such as, without limitation, plastic, resin, metals, etc. For example, without limitation, shell 305 may be composed of plastic materials to reduce the overall weight and cost of microchannel plate-fin heat exchanger 300. If metal is used, a brazing furnace operation may be used to produce shell 305 and heat exchanging element 380 simultaneously. Slots 370 may be precisely machined to match the size of microchannel flat tubes 355, which may be a critical quality control point.

Refrigerant pumps 325 may be, for example, without limitation, direct current (DC) pumps, alternating current (AC) pumps, etc., and may include variable speed control. Refrigerant pumps 325 may be installed within microchannel plate-fin heat exchanger 300 or installed remotely. If refrigerant pumps 325 are not self-priming, the installation height of refrigerant pumps 325 may be lower than the lower limits of liquid level 384 to ensure constant flooding of refrigerant pumps 325. Further, refrigerant pumps 325 may also be installed separately from shell 305 to achieve an optimal installation height for pump operations.

Refrigerant inlet 315 and refrigerant outlet 320 may include dripless adapters. Further, coolant inlet 330 and coolant outlet 335 may include, for example, without limitation, compression fittings, etc. depending on the pressure rating of charging the first fluid.

The interior surface of shell 305 and the exterior surface of heat exchanging element 380 may have an applied coating material to promote at least one of film-wise and drop-wise condensation to improve heat transfer characteristics. For example, hydrophilic coating or Hydrophobic coating may improve the surface characteristics which may improve heat transfer efficiency. In addition, the type of coating depends on which refrigerant may be used. Further, the interior surface of shell 305 may include one or more porous features, indentations, grooves, fins, etc. The porous features may be formed by spraying metal onto the interior surface of shell 305 and/or exterior surface of heat exchanging element 380. Indentations may be used to promote nucleation. Grooves and fins may be integrated onto the exterior surface of microchannel tubes 355 or interior surfaces of shell 305 during extrusion processes or second operations and may be longitudinally or laterally oriented relative to the flow direction of the first fluid. Different surface profiles of the microchannel flat tube may be realized by different extrusion dies. The surface roughness of the microchannel flat tubes may be adjusted by extra treatments such as grinding differently, as the second processing step after extrusion.

Figure 4A:
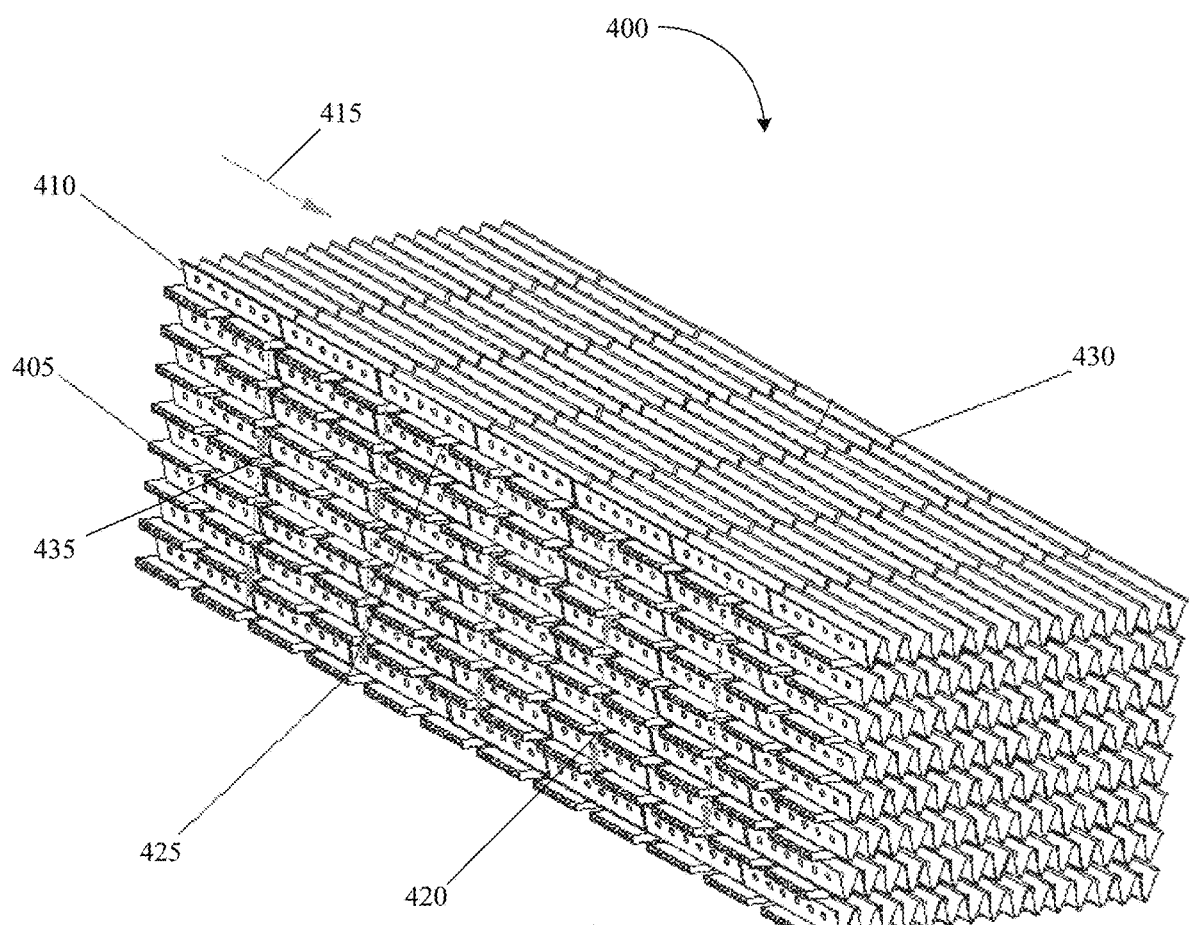
FIGS. 4A-4B illustrate an exemplary heat exchanging element, in accordance with an embodiment of the present invention.
Figure 4B:
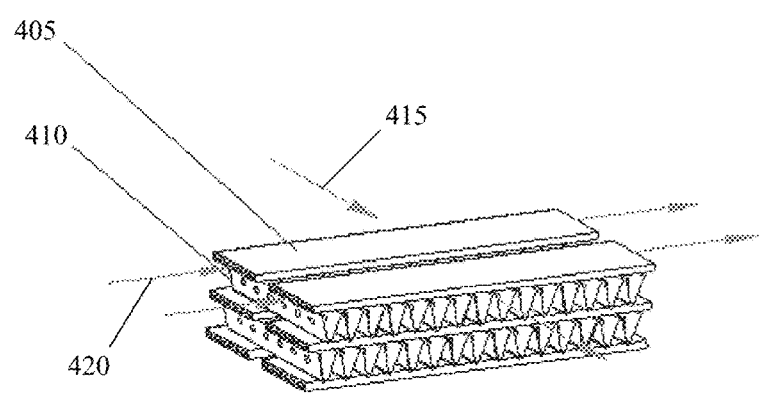

FIGS. 4A-4B illustrate an exemplary heat exchanging element, in accordance with an embodiment of the present invention. Heat exchanging element 400 may be present within microchannel plate-fin heat exchanger. Heat exchanging element 400 may comprise microchannel tubes 405 and fins 410. Microchannel tubes 405 may comprise, but not limited to, fundamentally or mostly flat, round, oblong, square, or rectangular shaped tubes. The flow direction of first fluid 415 may be perpendicular to the flow direction of second fluid 420, wherein first fluid 415 may be, for example, without limitation, a refrigerant, and second fluid 420 may be, for example, without limitation, a coolant. Thus, the pattern of first fluid 415 and second fluid 420 may result in cross-flow heat exchange, albeit tube gaps 425 between microchannel tubes 405 and fin gaps 430 between fins 410. Tube gaps 425 and fin gaps 430 may allow for first fluid 415 that has condensed on the outer surface of microchannel tubes 405 and fins 410 to flow to the bottom of heat exchanging element 400. Further, the relative positions of microchannel tubes 405 and fins 410 must be placed such that tube gaps 425 and fin gaps 430 do not overlap and there may be free passage for condensed first fluid 415 to flow to refrigerant liquid drains 435.

Figure 5:
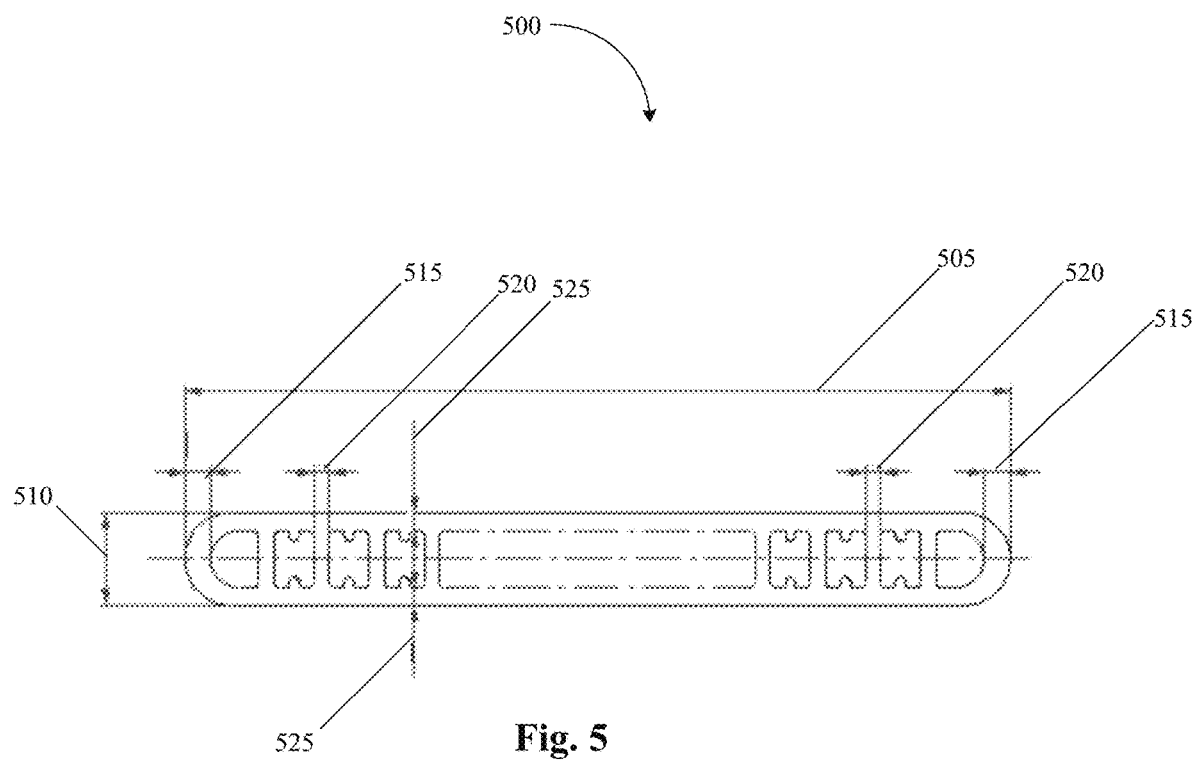
FIG. 5 illustrates a cross-section of an exemplary microchannel tube, in accordance with an embodiment of the present invention.

FIG. 5 illustrates a cross-section of an exemplary microchannel tube, in accordance with an embodiment of the present invention. The type, shape, and size of microchannel tube 500 may vary depending on the needs of a specific heat exchanger to achieve a desired hydraulic and thermal performance. Microchannel tubes 500 may comprise, but not limited to, considerably or mainly flat, round, oblong, square, or rectangular shaped tubes. More particularly, the dimensions of microchannel tube 500 may vary. For example, without limitation, first measurement 505 may be 16-38 mm, second measurement 510 may be between 1.3-6.5 mm, third measurement 515 may be between 0.35-0.5 mm, fourth measurement 520 may be between 0.3-0.4 mm, and fifth measurement 525 may be between 0.3-0.4 mm. Different sized and shaped microchannel tubes may provide an opportunity to balance a misdistribution of mass flow between the microchannel tubes due to size limits of manifolds. With regards to pressure drop of coolant through the microchannel tubes, fully developed laminar flow (boundary layer of walls join together) in microchannels should be avoided because smaller microchannel cross-sectional area needs shorter microchannels. On the other hand, full developed laminar flow will cause high convective heat transferring resistance. While the ranges listed above may be the measurements of microchannel tube 500 in the present embodiment, it should be understood by one skilled in the art that the aforementioned ranges are not limiting, and values outside the measurement ranges are still within the scope of the present embodiment.

FIG. 6A-6F illustrate exemplary fins, wherein FIG. 6A shows a plain type fin pattern, FIG. 6B shows a perforated type fin pattern, FIG. 6C shows a herringbone type fin pattern, FIG. 6D shows a louvered type fin pattern, FIG. 6E shows a serrated type fin pattern, and FIG. 6F shows fin dimensions, in accordance with an embodiment of the present invention. Different system requirements may require different fin types and dimensions too meet hydraulic and thermal requirements. Fin shapes may include, for example, without limitation, plain type, perforated type, herringbone type, louvered type, serrated type, etc. Additionally, different dimensions may be used for each fin. For example, without limitation, thickness 605 may be between 0.1-0.6 mm, pitch 610 may be between 0.9-8.5 mm, and height 615 may be between 2-25 mm. As will be appreciated by one skilled in the art, while the aforementioned ranges and fin types may be used in the present embodiment, measurements outside the aforementioned ranges and additional fin patterns are still within the scope of the present embodiment.

Figure 7A:
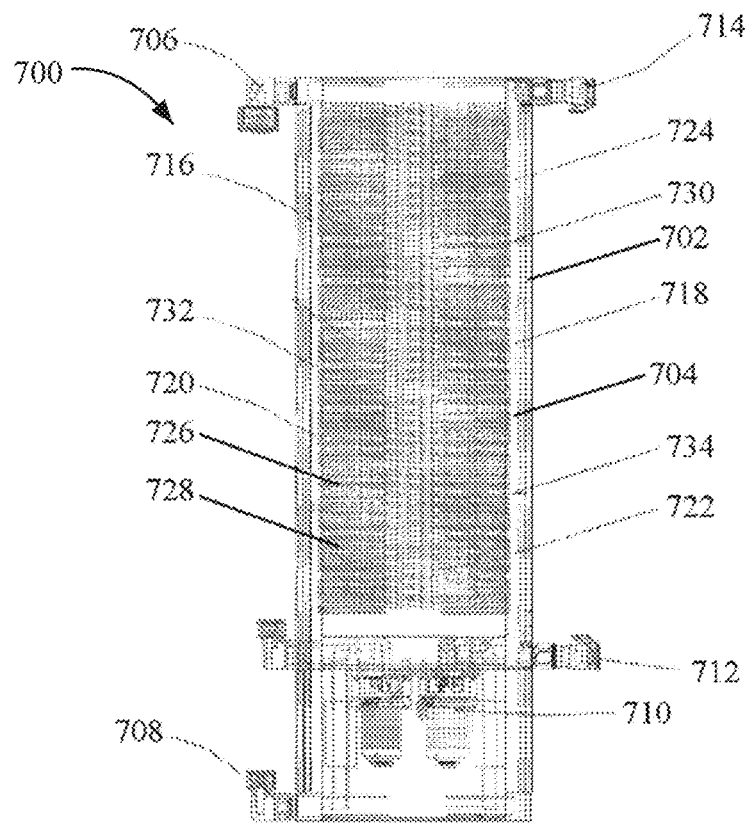
Figure 7B:
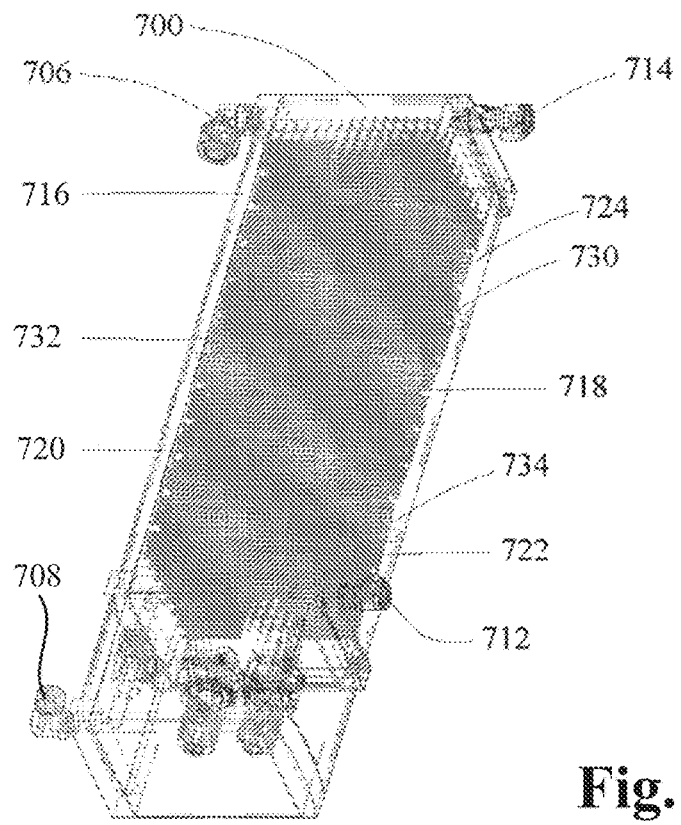

FIGS. 7A-7B illustrate an exemplary multi-pass flow microchannel heat exchanger, wherein FIG. 7A shows a plan view of a multi-pass flow microchannel heat exchanger, and FIG. 7B shows a perspective view of a multi-pass flow microchannel heat exchanger, in accordance with an embodiment of the present invention. By installing additional blind plates within heat exchanging element 400, a different flow pass may be realized, resulting in an optimized thermal and hydraulic performance. A multi-pass design may be advantageous in that higher outlet temperature for heat recovery may be achieved with a lower flow rate. However, this may also result in a high pressure drop, which may not be optimal for specific systems. Multi-pass flow microchannel heat exchanger 700 may comprise shell 702, interior 704, refrigerant inlet 706 and refrigerant outlet 708 coupled to shell 702 by which a first fluid (i.e., refrigerant) may flow in and out of interior 704, and one or more refrigerant pumps 710. Similarly, coolant inlet 712, coolant outlet 714, first coolant manifold 716, second coolant manifold 718, third coolant manifold 720, fourth coolant manifold 722, and fifth coolant manifold 724 may be configured to transmit a second fluid (i.e., coolant) through interior 704 of multi-pass flow microchannel heat exchanger 700 such that heat transfer may occur between the first fluid and the second fluid.

Fins 726 may be one or more configurations, as shown in FIGS. 6A-6F, and may be brazed between two microchannel tubes 728, or between one microchannel tube 728 and shell 702. Microchannel tubes 728 may comprise, but not limited to, basically flat, round, oblong, square, or rectangular shaped tubes. The flow passages formed between fins 726 and microchannel tubes 728 may vary depend on the type of fin used. Additionally, fins 726 may be intermittently spaced such that the gaps between fins 726 may not be covered by microchannel tubes 728, allowing for the free drainage of liquid condensed on the outer surface of fins 726 and microchannel tubes 728. Depending on the specific thermal and hydraulic performance requirements of a system, various types, heights, and pitches of fins may be used.

Fins 726 and microchannel tubes 728 may be dispersed longitudinally throughout interior 704 in one or more passes.

Microchannel tubes 728 may be brazed between separate manifolds, for example, without limitation, between third coolant manifold 720 and fourth coolant manifold 722 and internally connected with the manifolds. A second fluid (i.e., coolant) may flow within microchannel tubes 728 between fourth coolant manifold 722 and third coolant manifold 720 in a first pass. Similarly, the second fluid in microchannel tubes 728 may flow between second coolant manifold 718 and first coolant manifold 716 in a second pass, between second coolant manifold 718 and first coolant manifold 716 in a third pass, and between fifth coolant manifold 724 and first coolant manifold 716 in a fourth pass. The position and number of blind plates, such as, without limitation, first blind plate 730, second blind plate 732, third blind plate 734, etc. may determine the quantity of each pass and may determine the number of microchannel tubes 728 of each pass.

Microchannel tubes 728 may be installed within slots machined onto shell 702 such that the manifolds may be tightly brazed to microchannel tubes 728. The slots may be, for example, without limitation, machined horizontally in a normal configuration or machined with a certain angle of the horizon in an offset configuration, by which relevant microchannel tubes 728 and fins 726 may be at a certain angle with the horizon. The offset configuration may facilitate drainage of condensed second fluid. Additionally, microchannel tubes 728 may be in an inline or staggered matrix, with fins 726 also in a matching inline or staggered matrix. The number and size of microchannel tubes 728 may depend on criteria such as, but not limited to, heat load, pressure drop, efficiency, etc., which may be analyzed and optimized according to a computational program. Microchannel tube 728 may be configured longitudinally throughout interior 704 intermittently, and similarly fins 726 may be configured longitudinally throughout interior 704 intermittently. The gaps between microchannel tubes 728 and fins 726 may allow for proper drainage of condensed second fluid, and the positions of microchannel tubes 728 and fins 726 may ensure that the gaps do not overlap for free passage of the second fluid.

In addition to different second fluid flow types, different first fluid flow types may be used to alter the performance of a specific system. For example, without limitation, counterflow and crossflow may have their own advantages and disadvantages when used in a particular system.

Figure 8A:
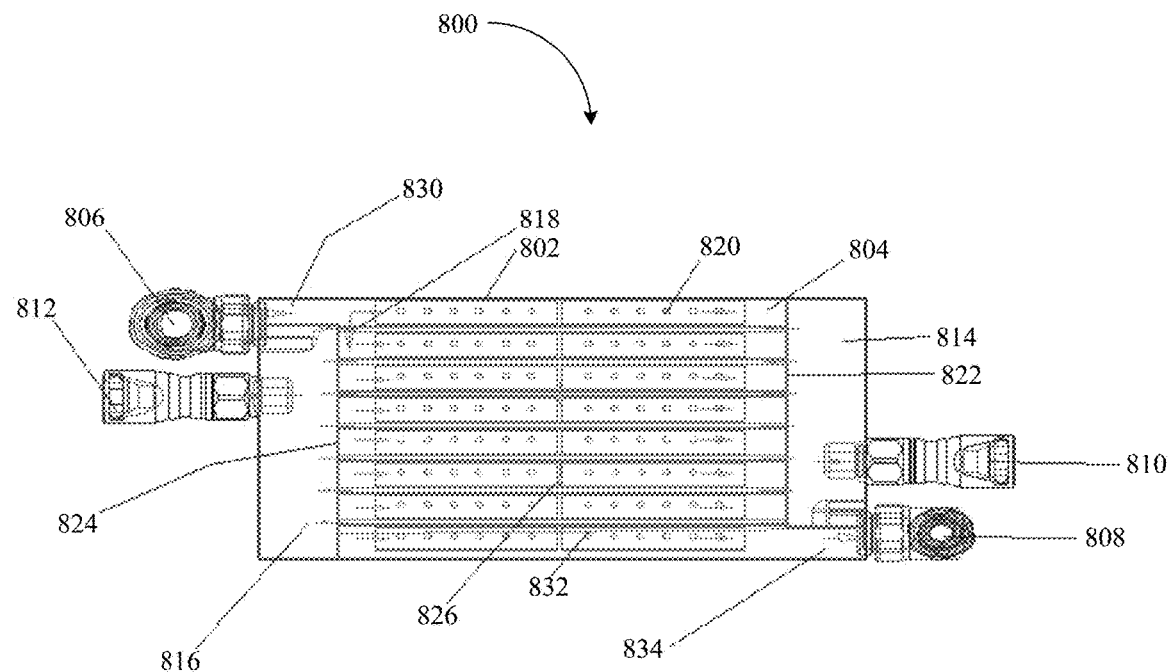
Figure 8B:
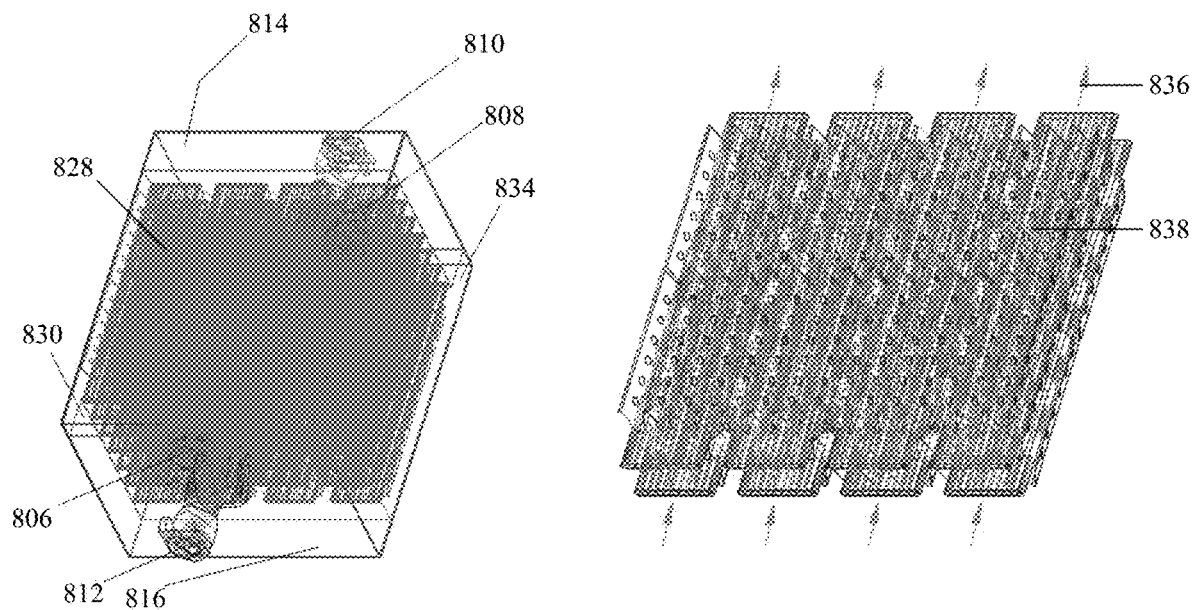
Figure 8C:
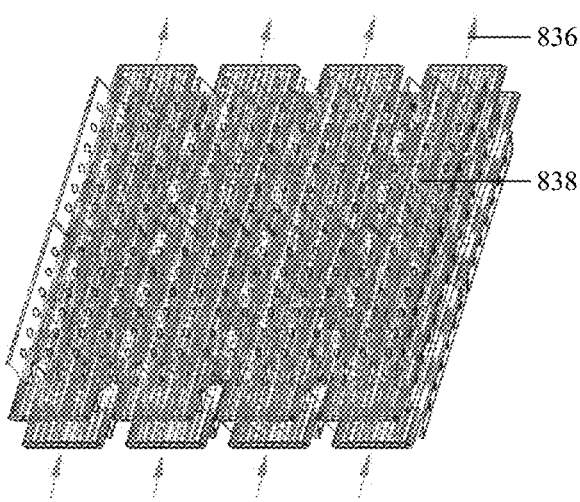

FIGS. 8A-8C illustrate an exemplary counterflow heat exchanger, wherein FIG. 8A shows a plan view of a counterflow heat exchanger, FIG. 8B shows a perspective view of a counterflow heat exchanger, and FIG. 8C shows a heat exchanging element of a counterflow heat exchanger, in accordance with an embodiment of the present invention. While a counterflow pattern may offer improved thermal performance, a pressure drops along microchannel flat tubes 818 may be a concern for longer heat exchangers. Additionally, the manifolds of a first fluid (i.e., refrigerant) and second fluid (i.e., coolant) may be on the same side, resulting in limited space to design an ideal manifold for even distribution of the first and second fluids. Counterflow heat exchanger 800 may comprise shell 802, interior 804, refrigerant inlet 806 and refrigerant outlet 808 coupled to shell 802 by which a first fluid (i.e., refrigerant) may flow in and out of interior 804. Similarly, coolant inlet 810, coolant outlet 812 coolant inlet manifold 814, coolant outlet manifold 816, and microchannel tubes 818 may be configured to transmit a second fluid (i.e., coolant) through interior 804 of counterflow heat exchanger 800 such that heat transfer may occur between the first fluid and the second fluid. Microchannel tubes 818 may comprise, but not limited to, normally flat, round, square, or rectangular shaped tubes.

The second fluid, such as, without limitation, coolant, water, glycol, etc. may be directed through the interior of microchannel tubes 818 while the first fluid, which may be a low-pressure refrigerant such as, but not limited to, R134a, R1234yf, HFE 7000, HFE 7100, etc., may flow into interior 804 to be condensed. As will be appreciated by one skilled in the art, the first fluid may also be a high-pressure refrigerant, such as, without limitation, R410A, $CO_2$, etc. may be directed through the interior of microchannel tubes 818 while the second fluid is directed through interior 804.

Microchannel tubes 818 and fins 820 may be longitudinally disposed throughout interior 804 of counterflow heat exchanger 800 in one or more passes. Microchannel tubes 818 may be brazed between one or more manifolds such as, without limitation, coolant inlet manifold 814 and coolant outlet manifold 816 at each side and may be internally connected to the manifolds. Microchannel tubes 818 may be installed between the slots on coolant inlet manifold endplate 822 and coolant outlet manifold endplate 824, and the manifolds may be tightly brazed with microchannel tubes 818. The slots on coolant inlet manifold endplate 822 and coolant outlet manifold endplate 824 may be, for example, without limitation, machined horizontally, machined at an angle to offset microchannel tubes 818 and fins 820 at different angles with the horizon, etc. An angular offset of the slots may further facilitate drainage of condensation. Microchannel tubes 818 and fins 820 may be placed in various patterns within microchannel plate-fin heat exchanger depending on the needs of a specific system. For example, without limitation, microchannel tubes 818 may be inline, in a staggered matrix, etc. and fins 820 may also be inline or staggered to correspond to microchannel flat tubes 818. The number and size of microchannel tubes 818 may depend upon criteria such as, without limitation, heat load, pressure drop, efficiency, etc. and may be analyzed and optimized for a specific system using a computational program. In the present embodiment, microchannel tubes 818 are configured longitudinally through interior 804 intermittently, and fins 820 are similarly configured longitudinally and vertically through interior 804 intermittently. Gaps between microchannel tubes 818 may be used to allow the condensed second fluid free pass of refrigerant liquid drain 826. Thus, the relative positions of microchannel tubes 818 and fins 820 must ensure that the gaps do not overlap. The type and size of microchannel tubes 818 may vary depending on the specifications of a system to achieve optimal hydraulic performance, as described above with reference to FIG. 5. Additionally, the type and size of fins 820 may also vary to achieve better performance, as described above with reference to FIGS. 6A-6F.

Heat exchanging element 828 may be formed from protruded microchannel tubes 818 and fins 820. The first fluid (i.e., refrigerant) may flow from refrigerant inlet 806 to refrigerant inlet manifold 830 and be condensed on the surface of microchannel tubes 818 and fins 820 as a result of heat transfer from the first fluid to the second fluid within microchannel flat tubes 818. The volume of refrigerant inlet manifold 830 must be large enough to allow for vapor-gas separation, as the first fluid from refrigerant inlet 806 may be a mixture of liquid and vapor. The vapor-gas separation may depend on the vapor velocity and geometrical flow path of vapor. The critical gravity separation vapor velocity may be calculated by Souders-Brown equations. The vapor may contact the cold surface of microchannel flat tubes 818 and fins 820, which may cause a portion of the vapor to be condensed. The dynamic equilibrium between the quantity of vapor condensing and the quantity of pump suction exists in the heat exchanger. Liquid condensed by cold coolant will be suctioned into the pump and then supplied to cool the heat sources. Accordingly, a two-phase status will be kept in the heat exchanger. Condensed liquid may be drained through the gaps between microchannel tubes 818 and fins 820 and collected at the bottom of shell 802. Liquid level 832 may be present at an initial charge and may need to be maintained above a certain level during the whole cooling process. The condensed liquid refrigerant may be suctioned through a remote refrigerant pump and supplied through refrigerant outlet 808 for electronic device cooling. The second fluid may flow into counterflow heat exchanger 800 through coolant inlet 810 and distributed into microchannel tubes 818 and fins 820. After heat is transferred from the first fluid to the second fluid through the surface of microchannel tubes 818 and fins 820, the second fluid may be collected by coolant outlet manifold 816 and may flow out of counterflow heat exchanger 800 via coolant outlet 812.

In the present embodiment, shell 802 may be composed of aluminum as a base metal with added copper and/or plastic. As will be appreciated by one skilled in the art, shell 802 may be composed of a variety of different materials, such as, without limitation, plastic, resin, metals, etc. For example, without limitation, shell 802 may be composed of plastic materials to reduce the overall weight and cost of counterflow heat exchanger 800. If metal is used, a brazing furnace operation may be used to produce shell 802 and heat exchanging element 828 simultaneously. The slots on coolant inlet manifold endplate 822 and coolant outlet manifold endplate 824 may be precisely machined to match the size of microchannel tubes 818, which may be a critical quality control point.

As shown in FIG. 8C, second fluid flow direction 836 in microchannel tubes 818 may be opposite to first fluid flow direction 838. Although there may be gaps between microchannel tubes 818 and fins 820, the counter flow of the first fluid and the second fluid may still enhance thermal performance.

Figure 9A:
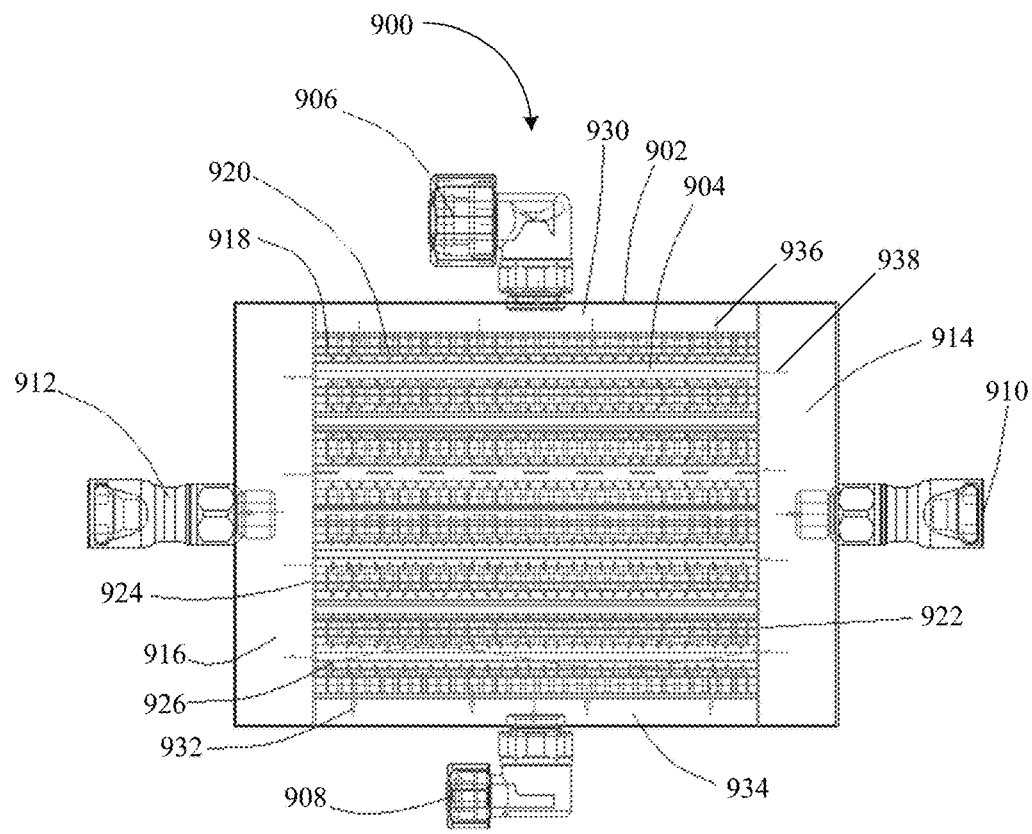
Figure 9B:
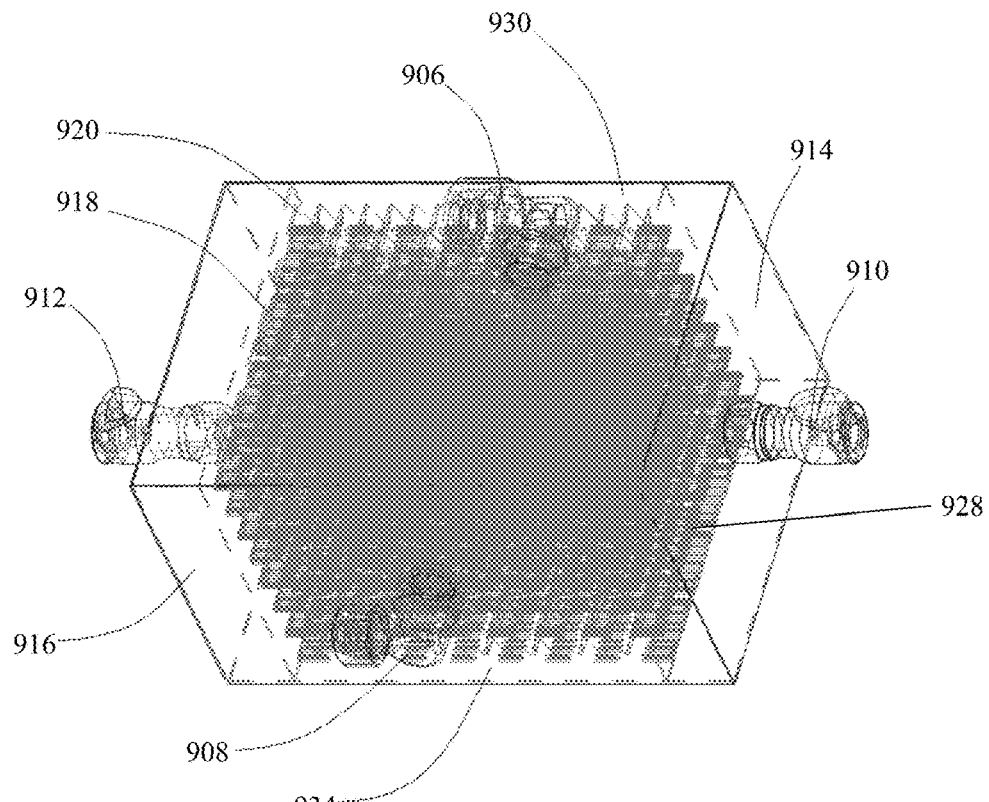

FIGS. 9A-9B illustrate an exemplary cross-flow heat exchanger, wherein FIG. 9A shows a plan view of a cross-flow heat exchanger, and FIG. 9B shows a perspective view of a cross-flow heat exchanger, in accordance with an embodiment of the present invention. While utilizing a cross-flow pattern, the pressure drop at the second fluid side may be more easily controlled by adopting a number of flow passes. Additionally, the manifolds of the first fluid and the second fluid may be located in different directions, which may reserve ample space for further optimization of manifold performance. Cross-flow may, however, may result in reduced thermal performance. Cross-flow heat exchanger 900 may comprise shell 902, interior 904, refrigerant inlet 906 and refrigerant outlet 908 coupled to shell 902 by which a first fluid (i.e., refrigerant) may flow in and out of interior 904. Similarly, coolant inlet 910, coolant outlet 912 coolant inlet manifold 914, coolant outlet manifold 916, and microchannel tubes 918 and fins 920 may be configured to transmit a second fluid (i.e., coolant) through interior 904 of cross-flow heat exchanger 900 such that heat transfer may occur between the first fluid and the second fluid. Microchannel tubes 918 may comprise, but not limited to, essentially flat, round, oblong, square, or rectangular shaped tubes.

The second fluid, such as, without limitation, coolant, water, glycol, etc. may be directed through the interior of microchannel flat tubes 918 while the first fluid, which may be a low-pressure refrigerant such as, but not limited to, R134a, R1234yf, HFE 7000, HFE 7100, etc., may flow into interior 904 to be condensed. As will be appreciated by one skilled in the art, the first fluid may also be a high-pressure refrigerant, such as, without limitation, R410A, $CO_2$, etc. may be directed through the interior of microchannel tubes 918 while the second fluid is directed through interior 904.

Microchannel tubes 918 and fins 920 may be longitudinally disposed throughout interior 904 of cross-flow heat exchanger 900 in one or more passes. Microchannel tubes 918 may be brazed between one or more manifolds such as, without limitation, coolant inlet manifold 914 and coolant outlet manifold 916 at each side and may be internally connected to the manifolds. Microchannel tubes 918 may be installed between the slots on coolant inlet manifold endplate 922 and coolant outlet manifold endplate 924, and the manifolds may be tightly brazed with microchannel tubes 918. The slots on coolant inlet manifold endplate 922 and coolant outlet manifold endplate 924 may be, for example, without limitation, machined horizontally, machined at an angle to offset microchannel tubes 918 and fins 920 at different angles with the horizon, etc. An angular offset of the slots may further facilitate drainage of condensation. Microchannel tubes 918 and fins 920 may be placed in various patterns within microchannel plate-fin heat exchanger depending on the needs of a specific system. For example, without limitation, microchannel tubes 918 may be inline, in a staggered matrix, etc. and fins 920 may also be inline or staggered to correspond to microchannel tubes 918. The number and size of microchannel tubes 918 may depend upon criteria such as, without limitation, heat load, pressure drop, efficiency, etc. and may be analyzed and optimized for a specific system using a computational program. In the present embodiment, microchannel tubes 918 are configured longitudinally through interior 904 intermittently, and fins 920 are similarly configured longitudinally and vertically through interior 904 intermittently. Gaps between microchannel tubes 918 may be used to allow the condensed second fluid free pass of refrigerant liquid drain 926. Thus, the relative positions of microchannel tubes 918 and fins 920 must ensure that the gaps do not overlap. The type and size of microchannel tubes 918 may vary depending on the specifications of a system to achieve optimal hydraulic performance, as described above with reference to FIG. 5. Additionally, the type and size of fins 920 may also vary to achieve better performance, as described above with reference to FIGS. 6A-6F.

Heat exchanging element 928 may be formed from protruded microchannel tubes 918 and fins 920. The first fluid (i.e., refrigerant) may flow from refrigerant inlet 906 to refrigerant inlet manifold 930 and be condensed on the surface of microchannel tubes 918 and fins 920 as a result of heat transfer from the first fluid to the second fluid within microchannel tubes 918. The volume of refrigerant inlet manifold 930 must be large enough to allow for vapor-gas separation, as the first fluid from refrigerant inlet 906 may be a mixture of liquid and vapor. The vapor-gas separation may depend on the vapor velocity and geometrical flow path of vapor. The critical gravity separation vapor velocity may be calculated by Souders-Brown equations. The vapor may contact the cold surface of microchannel tubes 918 and fins 920, which may cause a portion of the vapor to be condensed. The dynamic equilibrium between the quantity of vapor condensing and the quantity of pump suction may exist in the heat exchanger. Liquid condensed by cold coolant may be suctioned into the pump and then supplied to cool the heat sources. Accordingly, a two-phase status may be kept in the heat exchanger. Condensed liquid may be drained through the gaps between microchannel tubes 918 and fins 920 and collected at the bottom of shell 902. Liquid level 932 may be present at an initial charge, and a predetermined liquid level may need to be maintained throughout the cooling process. The condensed liquid refrigerant may be suctioned through a remote refrigerant pump and supplied through refrigerant outlet 908 for electronic device cooling. The second fluid may flow into cross-flow heat exchanger 900 through coolant inlet 910 and distributed into microchannel flat tubes 918 and fins 920. After heat is transferred from the first fluid to the second fluid through the surface of microchannel tubes 918 and fins 920, the second fluid may be collected by coolant outlet manifold 916 and flow out of cross-flow heat exchanger 900 via coolant outlet 912.

In the present embodiment, shell 902 may be composed of aluminum as a base metal with added copper and/or plastic. As will be appreciated by one skilled in the art, shell 902 may be composed of a variety of different materials, such as, without limitation, plastic, resin, metals, etc. For example, without limitation, shell 902 may be composed of plastic materials to reduce the overall weight and cost of cross-flow heat exchanger 900. If metal is used, a brazing furnace operation may be used to produce shell 902 and heat exchanging element 928 simultaneously. The slots on coolant inlet manifold endplate 922 and coolant outlet manifold endplate 924 may be precisely machined to match the size of microchannel tubes 918, which may be a critical quality control point.

As shown in FIG. 9A, second fluid flow direction 936 may be perpendicular to first fluid flow direction 938 within interior 904, creating a cross-flow pattern. Although there may be gaps between microchannel tubes 918 and fins 920, the crossflow may still be maintained and may still result in a more easily controlled pressure drop. The cross flow and counter flow are two typical layouts of heat exchangers. Compared to the counterflow, the manifolds of cross flow heat exchangers may be separately located at different sides of heat exchangers, which may make it easier to be manufactured and as a result, may lead to higher reliability and lower cost. Since the manifolds may be located at different sides, more space may be available to get bigger manifold which may translate to larger even flow distribution throughout the heat exchanger.

Figure 10:
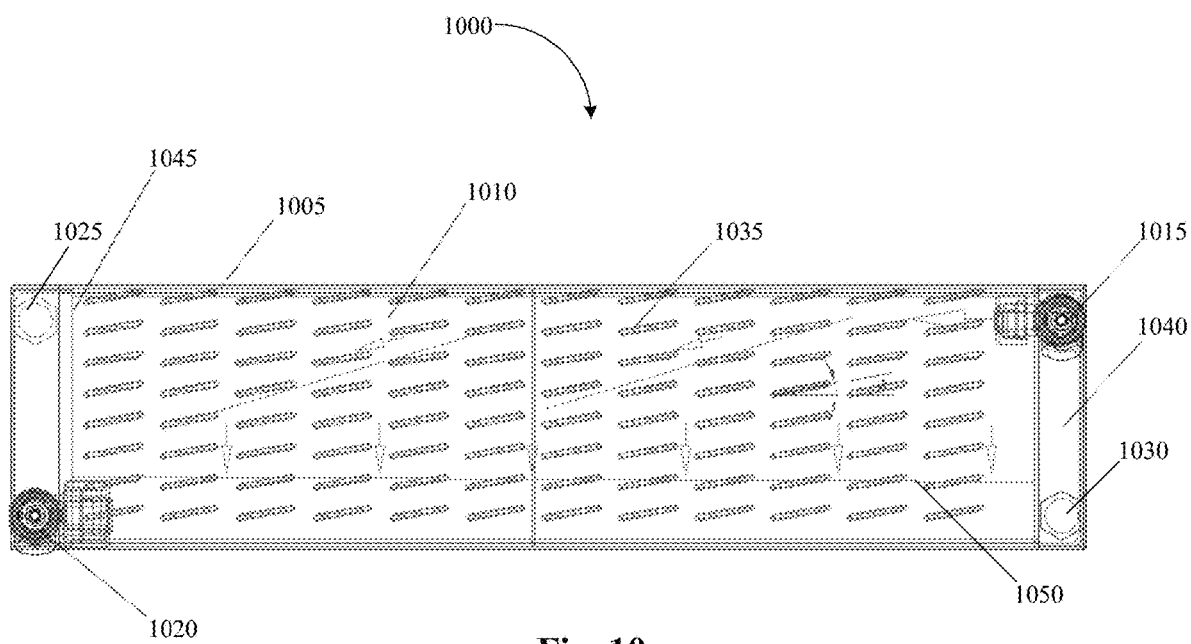
FIG. 10 illustrates an exemplary heat exchanger with angled microchannel tubes, in accordance with an aspect of the present invention.

FIG. 10 illustrates an exemplary heat exchanger with angled microchannel tubes, in accordance with an aspect of the present invention. Angled microchannel tubes 1035 may provide for better drainage of condensation when compared to conventional approaches and may result in a higher heat transferring coefficient. Angled microchannel tubes 1035 may comprise, but not limited to, fundamentally or mainly flat, round, oblong, square, or rectangular shaped tubes. However, a higher-pressure drop may occur, so angled microchannel tubes 1035 may not be ideal in every system. Heat exchanger 1000 may comprise shell 1005, interior 1010, refrigerant inlet 1015 and refrigerant outlet 1020 coupled to shell 1005 by which a first fluid (i.e., refrigerant) may flow in and out of interior 1010. Similarly, coolant inlet 1025, coolant outlet 1030, and angled microchannel tubes 1035 may be configured to transmit a second fluid (i.e., coolant) through interior 1010 of heat exchanger 1000 such that heat transfer may occur between the first fluid and the second fluid.

Second fluid such as, without limitation, coolant, water, glycol, etc. may be directed through angled microchannel flat tubes 1035. The heat exchanging element may be formed from protruded, angled microchannel flat tubes 1035. The first fluid (i.e., refrigerant) may flow from refrigerant inlet 1015 to refrigerant inlet manifold 1040 and condensed on the surface of angled microchannel tubes 1035 by the circulating cold second fluid. Angled microchannel tubes 1035 may be inclined at a certain angle with the horizon ($\varphi$). The edges of angled microchannel tubes 1035 at the upstream may be higher than the edges of angled microchannel tubes 1035 near the downstream such that the condensed first fluid may flow easily down the surface of angled microchannel tubes 1035. The thickness of the liquid film on the surface of angled microchannel tubes 1035 may be a critical factor in determining the heat transfer coefficient. The thinner the liquid film, the higher the heat transfer coefficient. Further, staggering of angled microchannel tubes 1035 may cause a first break up the laminar flow and thus enhance the convective heat transfer. Referring to FIG. 10, the microchannel tubes are in line vertically. The condensation could easily be drained to the bottom through the gaps between microchannel tubes. Another arrangement of microchannel tubes may be staggered vertically. The condensation from the upper microchannel tubes may be drained onto the surface of lower microchannel tubes, and then break the liquid film attached on the lower microchannel flat tubes. As a result, the heat transferring of lower microchannel tubes may be enhanced. The condensation drainage may be a critical factor to the efficiency of condensing heat transfer. As will be appreciated by one skilled in the art, the angle of angled microchannel tubes 1035 may be optimized for each specific system and may be different system to system. However, enhanced thermal performance may come at the cost of a higher pressure drop. The volume of refrigerant inlet manifold 1040 may not be critical to take the function of vapor-gas separation, as the void of volume in interior 1010 may be sufficiently large. The vapor may contact the cold surface of angled microchannel tubes 1035, and some of the vapor may be condensed. The condensed liquid may be drained along the surface of angled microchannel tubes 1035 and collected at the bottom of shell 1005. If liquid level 1050 exists at the initial charge, liquid level 1050 must be maintained during the cooling operation and may depend on the pumps. The dynamic equilibrium between the quantity of vapor condensing and the quantity of pump suction may exist in the heat exchanger. Liquid condensed by cold coolant may be suctioned into the pump and then supplied to cool the heat sources. Accordingly, a two-phase status may be present in the heat exchanger. Liquid first fluid after condensation may then be supplied through refrigerant outlet 1020 for electronic device cooling. The second fluid may flow into heat exchanger 1000 through coolant inlet 1025 and distributed through angled microchannel tubes 1035. After heat transfer between the first fluid and the second fluid is completed, the second fluid may be collected by a coolant manifold and flow out of heat exchanger 1000 through coolant outlet 1030.

Figure 11:
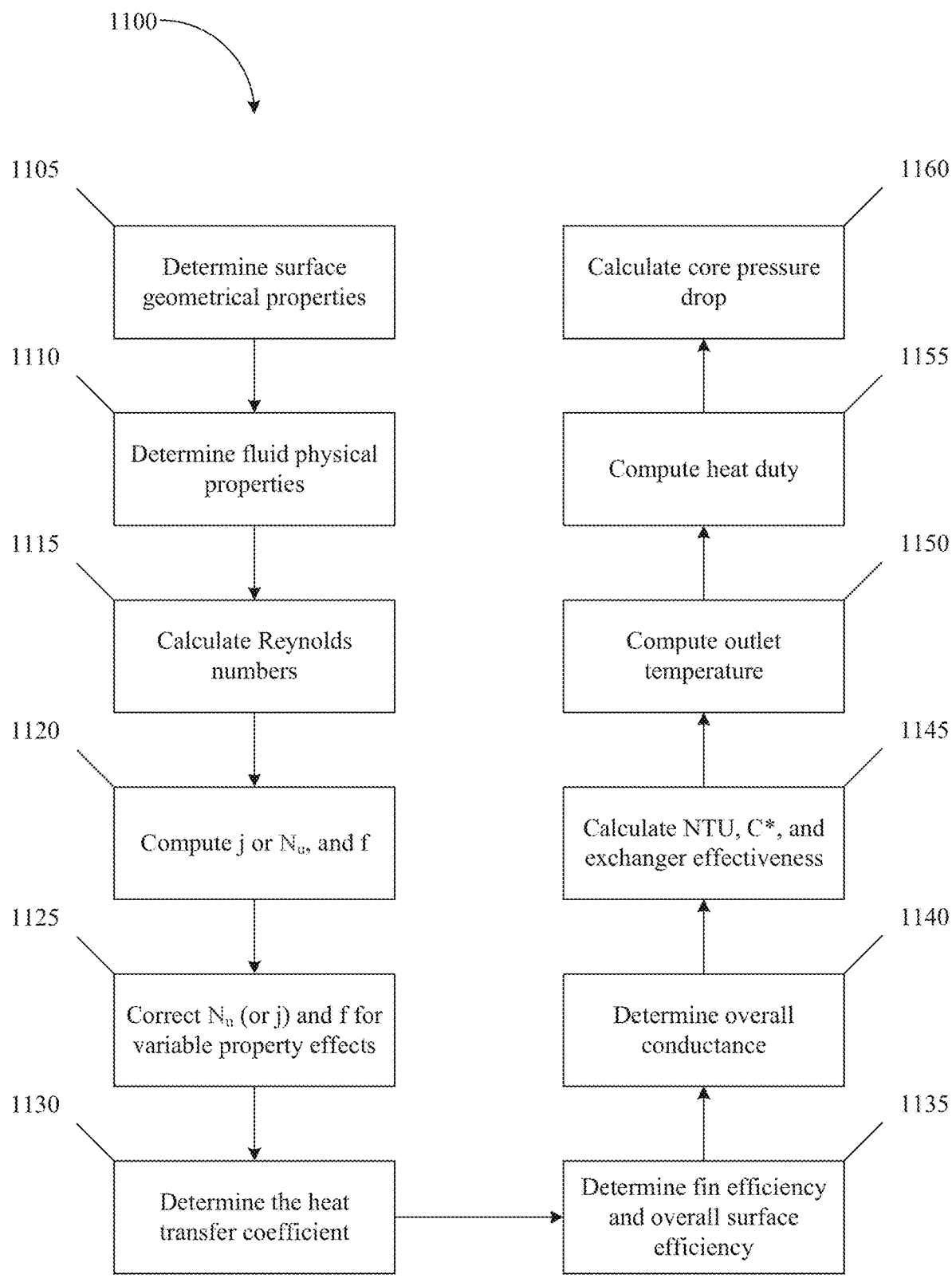
FIG. 11 illustrates flow chat of an exemplary process for designing a heat exchanger, in accordance with an embodiment of the present invention.

FIG. 11 illustrates flow chat of an exemplary process for designing a heat exchanger, in accordance with an embodiment of the present invention. Process 1100 may be used to design and optimize a heat exchanger for a particular system. Process 1100 may begin with a step 1105 wherein surface geometrical properties may be determined. The surface geometrical properties may include, for example, without limitation, minimum free flow area $A_o$, heat transfer surface area A (i.e., the total of primary surface area $A_p$, and secondary surface area, $A_f$), flow length L, hydraulic diameter $D_h$, heat transfer surface area density $\beta$, ratio of minimum free flow area to the frontal area $\sigma$, fin length $l_f$ and fin thickness $t_f$. Also included may be specialized dimensions used for heat transfer and pressure drop correlations. Process 1100 may continue with a step 1110, in which fluid physical properties may be determined. Fluid physical properties may include, for example, without limitation, Pr (Prandtl number), μ (viscosity of the fluid(kg/m·s)), Cp (specific heat(J/kg °C.)), and k (thermal conductivity of the fluid(W/m° C.)). As outlet temperatures are in general unknown for the rating problem, an initial guess may be used instead. Unless otherwise known, heat exchanger effectiveness may be assumed to be 60%-75% for most single-pass crossflow exchangers, and 80%-85% for single-pass counterflow and two-pass counterflow exchangers. For the assumed effectiveness, the fluid outlet temperatures may be calculated using:

$$t_{h,o} = t_{h,i} - \varepsilon \times C_{min}(t_{h,i} - t_{c,i})C_h \quad (eq.\ 1)$$

$$t_{c,o} = t_{c,i} - \varepsilon \times C_{min}(t_{h,i} - t_{c,i})C_c \quad (eq.\ 2)$$

Initially, assume $C_c/C_h \approx M_c/M_h$ for a gas-to-gas exchanger, or $C/C_c = (M_{cp})c/(M_{cp})h$ for a gas-to-liquid exchanger with approximate values of cp. For exchangers with $C^* \geq 0.5$ (usually gas-to-gas exchangers), the bulk means temperature on each side may be the arithmetic mean of the inlet and outlet temperatures on each side. For exchangers with $C^* < 0.5$ (usually gas-to-liquid exchangers), the bulk mean temperature for $C_{max}$ as the hot fluid may be $t_{h,m} = (t_{h,i} + t_{h,o})/2$, $t_{c,m} = t_{h,m} - \text{LMTD}$ and for $C_{max}$ as the cold fluid $t_{c,m} = (t_{c,i} + t_{c,o})/2$, $t_{h,m} = t_{c,m} + \text{LMTD}$. Once the bulk means temperatures are obtained on each side, fluid properties may he obtained from thermophysical property tables or standard thermal engineering books.

Process 1100 may then continue with a step 1115 wherein Reynold number and/or any other pertinent dimensionless groups may be calculated, such as, without limitation, j or $N_u$ and f of heat transfer surfaces on each side of the exchanger. In a step 1120 of process 1100, $N_u$ (or j) and f may be calculated. $N_u$ (or j) and f may then be corrected for variable fluid property effects in the second and subsequent iterations in a step 1125 of process 1100. A heat transfer coefficient may be determined in a step 1130 of process 1100 from $N_u$ or j according to:

$$h = N_u k/D_h$$

or:

$$h = jGC_p Pr^{-2/3}$$

In a step 1135 of process 1100, fin efficiency $\eta_f$ and the overall surface efficiency $\eta_o$ may be calculated according to:

$$\eta_f = \tanh(ml)/(ml),\ \text{where l is the fin length, and}$$

$$\eta_o = 1 - A_f(1-\eta_f)/A$$

In a step 1140 of process 1100, overall conductance may be determined. To do so, wall thermal resistance $R_w$ may be calculated, and, knowing the fouling resistances $R_{f,h}$ and $R_{f,c}$ on the hot and cold fluid sides, respectively, the overall thermal conductance UA may be calculated from:

$$1/(UA) = 1/(\eta_o hA)_h + R_{f,h}/(\eta_o A)_h + R_w + 1/(\eta_o hA)_c + R_{f,c}/(\eta_o A)_c = R_h + R_1 + R_w + R_2 + R_c$$

In a step 1145 of process 1100, NTU, $C^*$, and exchanger effectiveness ε may be calculated. If the thermal effectiveness is above 80%, the wall longitudinal conduction effect may be corrected for. Process 1100 may then continue with a step 1150, wherein outlet temperature may be computed from eq. 1 and eq. 2. If these outlet temperatures differ significantly from those assumed in step 1110, the outlet temperatures of step 1110 may be used, and steps 1110-1145 may be repeated until the assumed and computed outlet temperatures converge with the desired degree of accuracy. For a gas-to-gas exchanger, one or two iterations may be expected. In a step 1155 of process 1100, heat duty may be computed according to:

$$q = \varepsilon C_{min}(t_{h,i} - t_{c,i})$$

In a step 1160 of process 1100, core pressure drop may be calculated. The friction factor f on each side may also be corrected for variable fluid properties. The wall temperature may be computed according to:

$$T_{w,h} = t_{m,h} - q(R_h + R_1)$$

$$T_{w,c} = t_{m,c} - q(R_c + R_2)$$

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied.

All the features disclosed in this specification, including any accompanying abstract and drawings, may be replaced by alternative features serving the same, equivalent, or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(f)) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 USC § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing a microchannel heat exchanger according to the present invention will be apparent to those skilled in the art. Various aspects of the invention have been described above by way of illustration, and the specific embodiments disclosed are not intended to limit the invention to the particular forms disclosed. The particular implementation of the microchannel heat exchanger may vary depending upon the particular context or application. By way of example, and not limitation, the microchannel heat exchanger described in the foregoing were principally directed to electronics cooling implementations; however, similar techniques may instead be applied to air conditioning, chillers, etc., which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

Only those claims which employ the words "means for" or "steps for" are to be interpreted under 35 USC 112, sixth paragraph (pre-AIA) or 35 USC 112(f) post-AIA. Otherwise, no limitations from the specification are to be read into any claims, unless those limitations are expressly included in the claims.

What is claimed is:

1. A system, comprising:
    a shell, comprising:
        a heat exchanger, configured to be operable for heat transfer between a first fluid and a second fluid;
        a reservoir, configured to accumulate condensed first fluid within the shell; and
        a pump, configured to move the accumulated condensed first fluid from the reservoir;
    a refrigerant inlet, wherein the first fluid passes from the refrigerant inlet to an interior space of the shell for heat transfer, wherein the first fluid comprises at least one of a mixture of liquid and vapor, a liquid, or a vapor;
    a refrigerant inlet manifold, configured to collect the first fluid from the refrigerant inlet for the heat transfer;
    a refrigerant outlet, configured to receive the accumulated condensed first fluid from the pump and supply the first fluid for electronic device cooling;
    a coolant inlet, wherein the second fluid flows from the coolant inlet and into a plurality of coolant manifolds interconnected by first and second pluralities of microchannel tubes for the heat transfer; and
    a coolant outlet, configured to be operable for discharging the second fluid out of the plurality of coolant manifolds,
    wherein a first portion of the plurality of coolant manifolds includes at least one cut plate, and a second portion of the plurality of coolant manifolds includes a number of cut plates greater than the at least one cut plate of the first portion.

2. The system of claim 1, wherein the heat exchanger comprises at least one of a microchannel plate-fin heat exchanger, a multi-pass flow microchannel heat exchanger, a counterflow heat exchanger, a cross-flow heat exchanger, or a heat exchanger with angled microchannel tubes, wherein the heat exchanger further comprises a heat exchanging element including the first and second pluralities of microchannel tubes, each of the first and second pluralities of microchannel tubes comprising:

at least one of mainly, flat, round, oblong, square, or rectangular shaped tubes; and a plurality of fins, wherein the second fluid comprises a coolant configured to be operable for cooling the first and second pluralities of microchannel tubes, and wherein the first fluid comprises a refrigerant, wherein the first fluid is configured to make contact with an outside surface of the first and second pluralities of microchannel tubes and the plurality of fins for heat transfer between the first fluid and the second fluid.

3. The system of claim 2, comprising a first coolant manifold of the plurality of coolant manifolds, the first coolant manifold configured to be operable for collecting an outflow of the second fluid from the second plurality of microchannel tubes and guide the second fluid to the coolant outlet.

4. The system of claim 3, comprising a second coolant manifold of the plurality of coolant manifolds, the second coolant manifold configured to be operable for collecting an outflow of the second fluid from the first plurality of microchannel tubes and distribute the second fluid into the second plurality of microchannel tubes for heat transfer between the first fluid and the second fluid.

5. The system of claim 4, comprising a third coolant manifold of the plurality of coolant manifolds, the third coolant manifold configured to collect the second fluid from the coolant inlet and distribute the second fluid into the first plurality of microchannel tubes for heat transfer between the first fluid and the second fluid.

6. The system of claim 1, wherein the heat exchanger comprises at least one of a microchannel plate-fin heat exchanger, a multi-pass flow microchannel heat exchanger, a counterflow heat exchanger, a cross-flow heat exchanger, or a heat exchanger with angled microchannel tubes.

7. The system of claim 1, further comprising a refrigerant pump suction line or refrigerant liquid drain coupled between the reservoir and the pump.

8. The system of claim 7, wherein the pump comprises a plurality of pumps, each having its own refrigerant pump suction line to the reservoir.

9. The system of claim 1, wherein the first fluid is received by the refrigerant inlet from one or more heat sources.

10. The system of claim 1, wherein a level of the accumulated condensed first fluid in the reservoir is maintained above a predetermined level throughout a cooling process.

11. The system of claim 1, wherein the heat exchanger comprises the first and second pluralities of microchannel tubes, and wherein each of the first and second pluralities of microchannel tubes comprises at least one of mainly, flat, round, oblong, square, or rectangular shaped tubes.

12. The system of claim 11, wherein the heat exchanger further comprises a plurality of fins, and wherein the plurality of fins are one or more of brazed between microchannel tubes or between microchannel tubes and the shell.

13. The system of claim 1, wherein the first fluid comprises a mixture of liquid and vapor, wherein:

the first fluid comprises a refrigerant including at least one of: R134a, R1234yf, R410A, HFE 7000, or HFE 7100; and the second fluid comprises a coolant including at least one of water, glycol, or brine.

14. A system comprising:

a shell comprising a shell interior, the shell interior configured to house a heat exchanger, the heat exchanger configured to be operable for heat transfer between a first fluid and a second fluid, wherein the heat exchanger comprises first and second pluralities of microchannel tubes;

a coolant inlet, wherein the second fluid flows from the coolant inlet and into a plurality of coolant manifolds interconnected by the first and second pluralities of microchannel tubes for the heat transfer, wherein the second fluid comprises a coolant;

a coolant outlet, configured to be operable for discharging the second fluid out of the plurality of coolant manifolds;

a refrigerant inlet, wherein the first fluid passes from the refrigerant inlet to the shell interior for the heat transfer, wherein the first fluid comprises a refrigerant;

a refrigerant inlet manifold, configured to distribute the first fluid to the shell interior, wherein the first fluid flows from the refrigerant inlet around outer surfaces of the first and second pluralities of microchannel tubes;

a reservoir, configured to accumulate condensed first fluid within the shell interior;

a pump, configured to suction the accumulated condensed first fluid from the reservoir; and a refrigerant outlet, configured to supply the accumulated condensed first fluid from the pump for electronic device cooling, wherein a first portion of the plurality of coolant manifolds includes at least one cut plate and a second portion of the plurality of coolant manifolds includes a number of cut plates greater than the at least one cut plate of the first portion.

15. The system of claim 14, further comprising a plurality of fins, the plurality of fins one or more of brazed between microchannel tubes or between microchannel tubes and the shell.

16. The system of claim 15, wherein the heat exchanger comprises at least one of a microchannel plate-fin heat exchanger, a multi-pass flow microchannel heat exchanger, a counterflow heat exchanger, a cross-flow heat exchanger, or a heat exchanger with angled microchannel tubes, wherein each of the first and second pluralities of microchannel tubes comprises at least one of mainly, flat, round, oblong, square, or rectangular shaped tubes.

17. The system of claim 14, further comprising:

a refrigerant pump suction line or refrigerant liquid drain coupled between the reservoir and the pump.

18. The system of claim 14, wherein the first fluid is received by the refrigerant inlet from one or more heat sources.

19. The system of claim 14, wherein the plurality of coolant manifolds comprises:

a first coolant manifold, configured to be operable for collecting an outflow of the second fluid from the second plurality of microchannel tubes and guide the second fluid to the coolant outlet, wherein the second fluid comprises a coolant;

a second coolant manifold, configured to be operable for collecting an outflow of the second fluid from the first plurality of microchannel tubes and distribute the second fluid into the second plurality of microchannel tubes for heat transfer between the first fluid and the second fluid; and a third coolant manifold, configured to collect the second fluid from the coolant inlet and distribute the second fluid into the first plurality of microchannel tubes for heat transfer between the first fluid and the second fluid.

20. The system of claim 14, wherein the pump comprises a plurality of pumps, each having its own refrigerant pump suction line to the reservoir.

* * * * *